(12) United States Patent
Nasrullah et al.

(10) Patent No.: US 11,329,734 B2
(45) Date of Patent: May 10, 2022

(54) METHOD AND APPARATUS TO USE ACTIVE SEMICONDUCTOR INTERPOSERS FOR RF SIGNAL CHAIN IN MODULAR STACKED INTEGRATED CIRCUITS

(71) Applicant: Shenzhen Chipuller Chip Technology Co., LTD., Shenzhen (CN)

(72) Inventors: Jawad Nasrullah, Mountain View, CA (US); Omar Alnaggar, Mountain View, CA (US); Hanfeng Wang, Mountain View, CA (US); Mohamed Sameh Mahmoud, Mountain View, CA (US)

(73) Assignee: SHENZHEN CHIPULLER CHIP TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 17/072,927

(22) Filed: Oct. 16, 2020

(65) Prior Publication Data

US 2021/0143921 A1     May 13, 2021

Related U.S. Application Data

(60) Provisional application No. 62/931,971, filed on Nov. 7, 2019.

(51) Int. Cl.
| | |
|---|---|
| *H04B 17/21* | (2015.01) |
| *H04B 17/19* | (2015.01) |
| *H04B 17/11* | (2015.01) |
| *H04B 1/40* | (2015.01) |
| *H01L 23/528* | (2006.01) |
| *H04B 1/44* | (2006.01) |

(52) U.S. Cl.
CPC .......... *H04B 17/21* (2015.01); *H01L 23/528* (2013.01); *H04B 1/44* (2013.01); *H04B 17/11* (2015.01); *H04B 17/19* (2015.01)

(58) Field of Classification Search
CPC .......... H04B 1/38; H04B 1/3827; H04B 1/40; H04B 1/44; H04B 1/0458; H04B 17/11; H04B 17/19; H04B 17/21; H04B 17/29; H04W 88/00; H04W 88/02; H04W 88/06; H01L 23/5226; H01L 23/528; H01L 2924/14; H01L 2924/1421
See application file for complete search history.

(56) References Cited

U.S. PATENT DOCUMENTS

| | | | |
|---|---|---|---|
| 8,536,693 B2* | 9/2013 | Dungan | H01L 25/0652 257/686 |
| 8,948,706 B2* | 2/2015 | Napoles | H03H 7/40 455/73 |
| 9,035,677 B2* | 5/2015 | Nguyen | H04L 25/0282 326/82 |
| 9,717,008 B1* | 7/2017 | Sharma | H04W 24/06 |
| 10,260,961 B2* | 4/2019 | Ferguson | H01L 23/34 |
| 10,320,051 B2* | 6/2019 | Chiu | H05K 7/20336 |
| 10,320,494 B2* | 6/2019 | Chung | H04B 17/19 |
| 10,886,963 B2* | 1/2021 | Sengupta | H01Q 5/335 |

* cited by examiner

*Primary Examiner* — Quochien B Vuong
(74) *Attorney, Agent, or Firm* — Mughal IP P.C.

(57) ABSTRACT

Described are methods and apparatuses pertaining to stacked integrated circuits having application in ultra-low-power and small form factor design, with fast prototyping and mass-production cycle time, including application for millimeter wave radio frequency circuits.

20 Claims, 17 Drawing Sheets

METHOD AND APPARATUS TO USE ACTIVE SEMICONDUCTOR INTERPOSERS FOR RF SIGNAL CHAIN IN MODULAR STACKED INTEGRATED CIRCUITS

CLAIM FOR PRIORITY

This application is a continuation of, and claims the benefit of priority to U.S. Provisional Patent Application No. 62/931,971, filed on Nov. 7, 2019, titled "METHOD AND APPARATUS TO USE ACTIVE SEMICONDUCTOR INTERPOSERS FOR RF SIGNAL CHAIN IN MODULAR STACKED INTEGRATED CIRCUITS," and which is incorporated by reference in entirety.

BACKGROUND

Design of electronic systems may be based on use of electronic components manufactured by specialized fabrication processes. Traditionally, such systems have been built on a printed circuit board by connecting a number of electronic components together. Systems built using printed circuit board and discrete components may result in bulky, energy inefficient designs, with potential limitations on radio frequency design. Internet-of-Things, Edge Artificial Intelligence (Edge AI), and $5^{th}$ Generation wireless communication (5G) application circuits might be disposed to operate with limited energy for an extended period of time, and to do so for radio waves with wavelengths in the range of few millimeters. Such high frequency design may benefit significantly from miniaturized components.

BRIEF DESCRIPTION OF THE DRAWINGS

The embodiments of the disclosure will be understood more fully from the detailed description given below and from the accompanying drawings of various embodiments of the disclosure. However, while the drawings are to aid in explanation and understanding, they are only an aid, and should not be taken to limit the disclosure to the specific embodiments depicted therein.

DETAILED DESCRIPTION

Figure 1A:
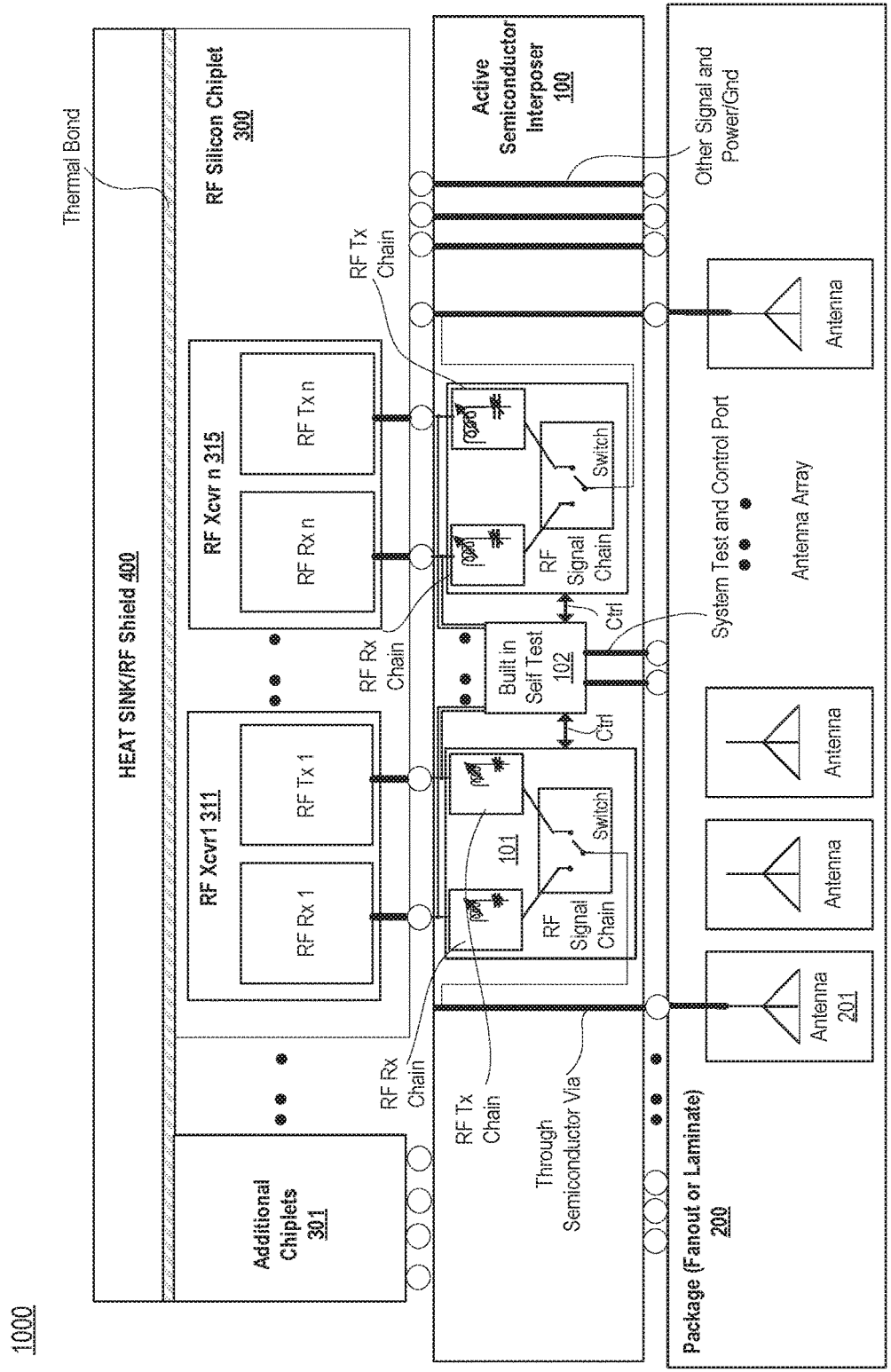
FIGS. 1A-1E illustrate a heterogeneously integrated circuit with an active semiconductor interposer containing Radio Frequency (RF) signal chains and an RF built-in self-test mechanism, in accordance with some embodiments of the disclosure.
Figure 1B:
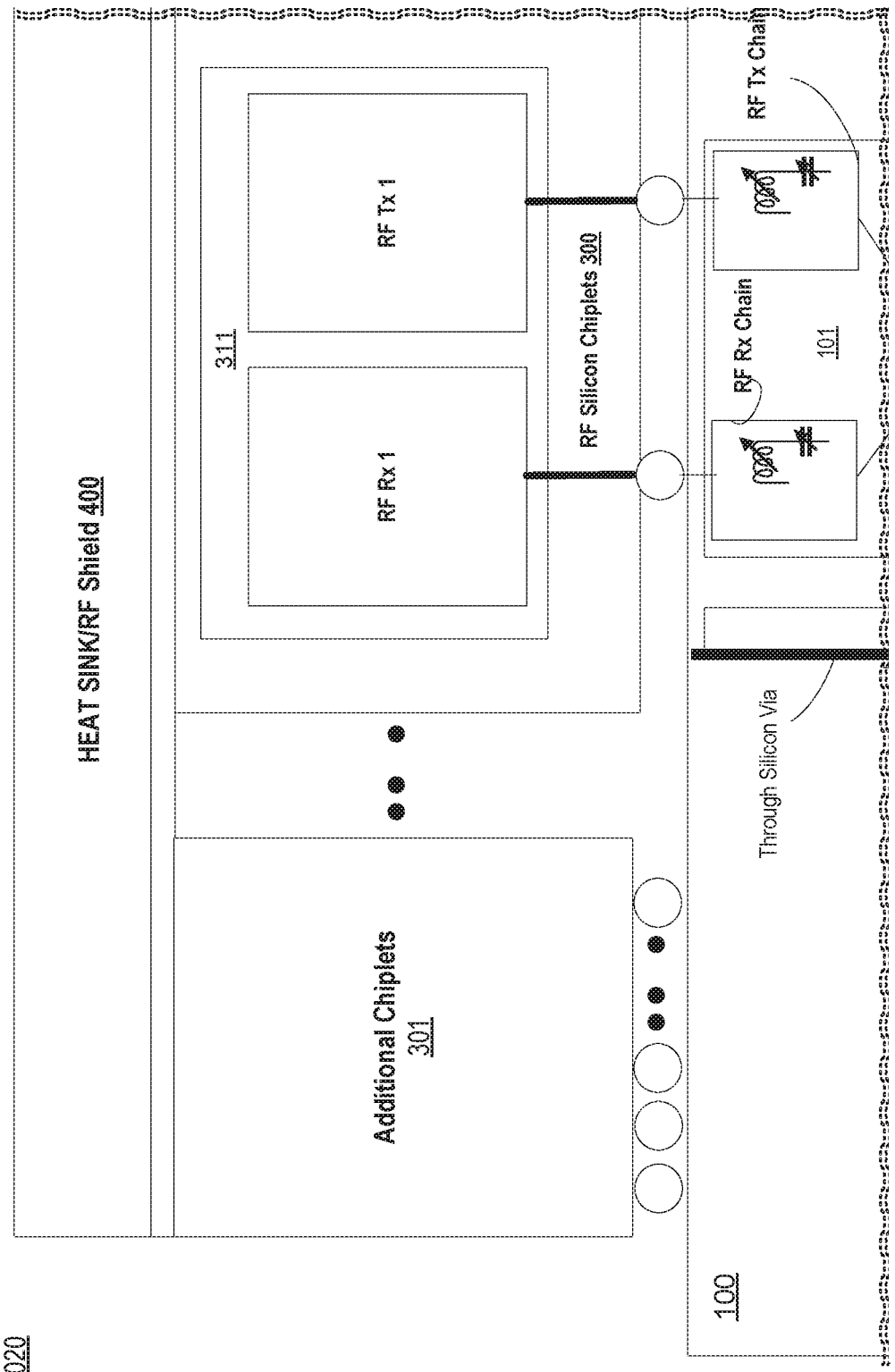
Figure 1C:
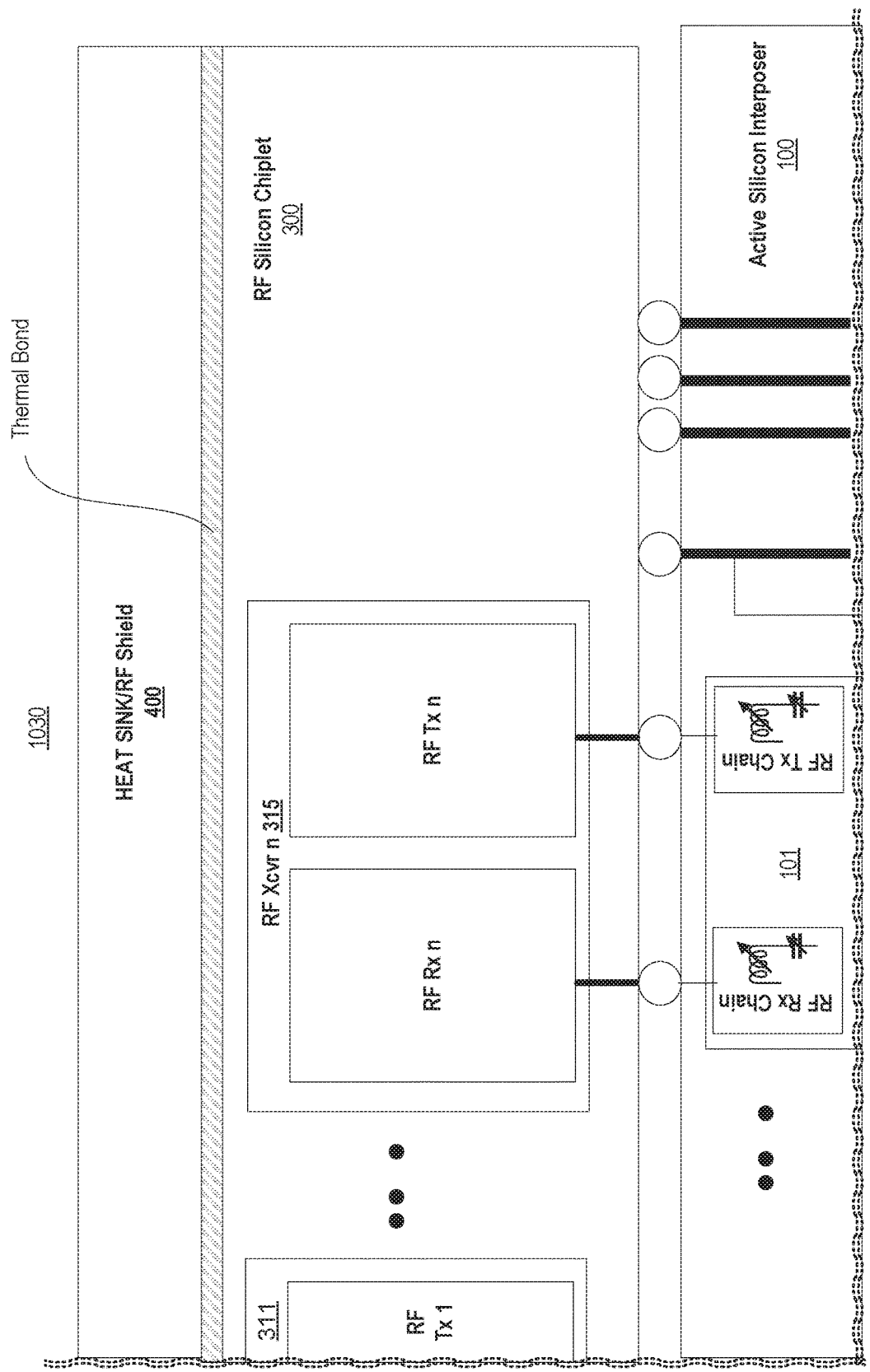
Figure 1D:
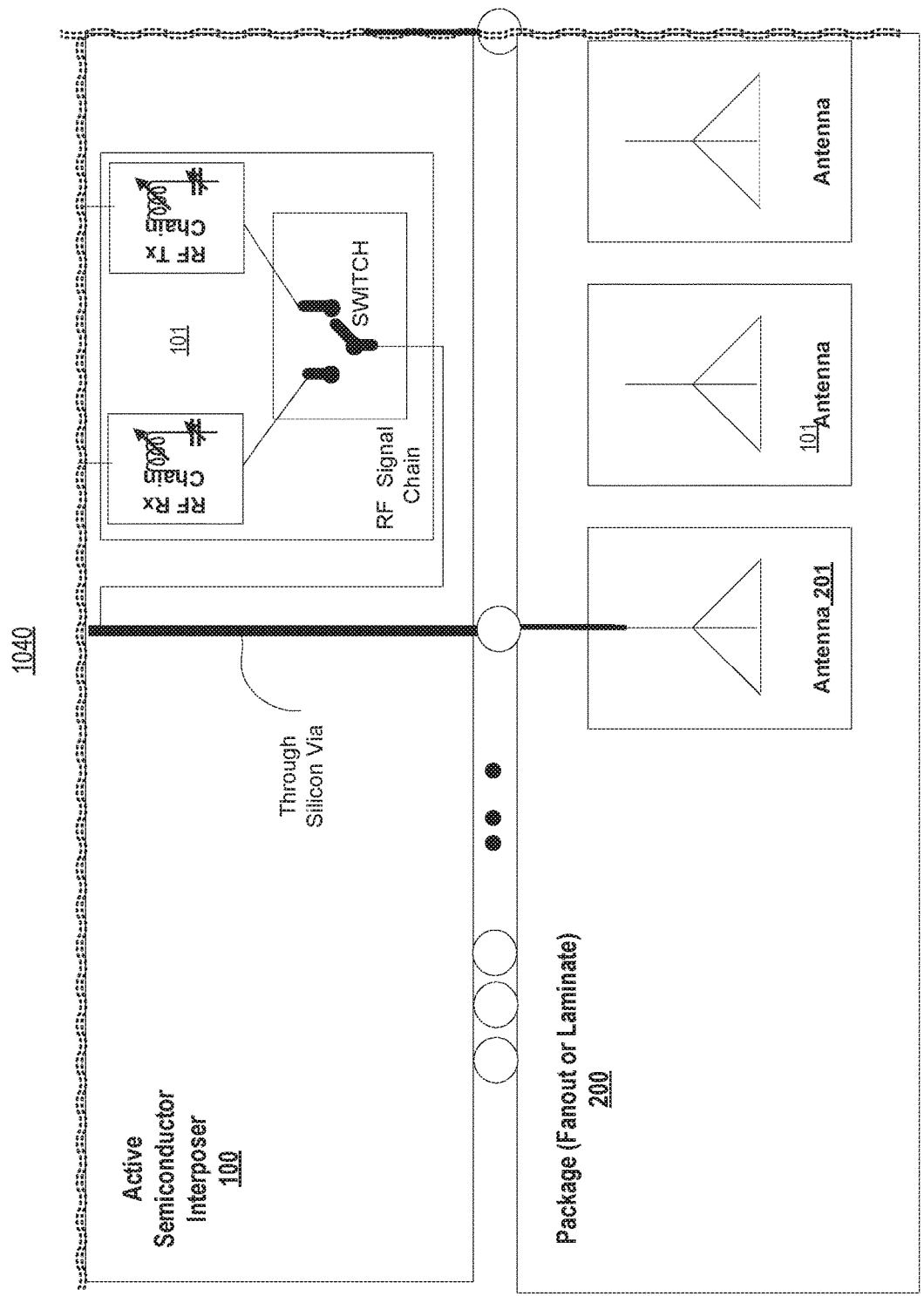
Figure 1E:
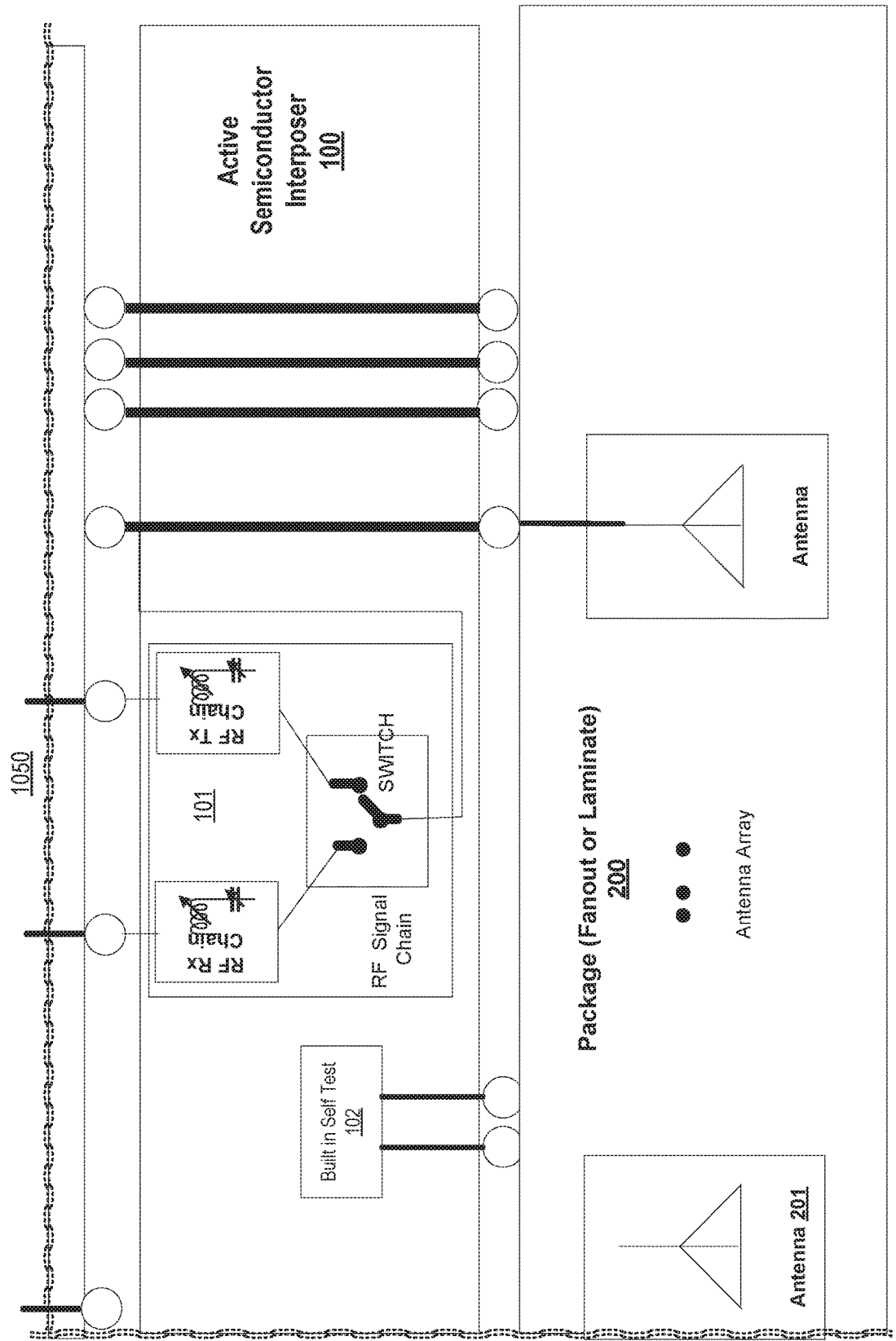

In various embodiments, extreme miniaturization may facilitate and/or enable electronic systems having small form factors, ultra-low-power operation, and new capacity to support 5G millimeter-band radio circuits in an active semiconductor interposer. In various embodiments, the semiconductor may comprise silicon and/or a compound or composite semiconductor material such as silicon-germanium (SiGe) or indium phosphide (InP). Disclosed herein are methods and apparatuses related to active semiconductor interposers that may provide functions such as low noise amplification, impedance matching, phase angle control for antenna arrays and beam steering, signal path switching, and testability. Accordingly, various embodiments may pertain to stacked integrated circuits having application to ultra-low-power and small form factor design, with fast prototyping and mass-production cycle time, including application for millimeter wave radio frequency circuits.

Some embodiments are provided as machine-readable instructions in a machine-readable storage media. These machine-readable instructions when executed cause an apparatus (e.g., one or more machine) to perform a method. The apparatus comprises: a package substrate comprising an array of antennas; an active interposer coupled to the package substrate; an RF silicon coupled to the active interposer; and a heat sink coupled to the RF silicon via a thermal bond, wherein the RF silicon comprises RF transceiver chiplets in a daisy chain configuration, wherein the active interposer includes an RF signal chain configured to: test the RF transceiver chiplets for transmission error; and tune and/or calibrate a matching network of an individual transceiver chiplet, from among the RF transceiver chiplets, to achieve maximum power transfer.

In some embodiments, the method performed via the machine-readable instructions comprises: coupling RF transceiver chiplets, in an active RF silicon, in a daisy chain configuration; testing the RF transceiver chiplets for transmission error; tuning and/or calibrating a matching network of an individual transceiver chiplet, from among the RF transceiver chiplets, to achieve maximum power transfer; and storing values of the tuned and/or calibrated matching network in memory.

In some embodiments, coupling the RF transceiver chiplets comprises applying or using integrated RF switches in an active interposer to couple the RF transceiver chiplets. In some embodiments, testing the RF transceiver chiplets for transmission error comprises transmitting a known bit stream from a first RF transceiver chiplet to a last RF transceiver chiplet in the daisy chain configuration; and comparing the known bit stream with a bit stream received by the last RF transceiver chiplet.

In some embodiments, the method comprises breaking the daisy chain into a shorter daisy chain in response to determining that the known bit stream does not match with the bit stream received by the last RF transceiver chiplet. In some embodiments, the method comprises setting the RF transceiver chiplets to transmit at a particular power level in response to determining that the known bit stream matches with the bit stream received by the last RF transceiver chiplet. In some embodiments, the method comprises measuring output power levels of the RF transceiver chiplets; applying matching networks to maximize the output power levels; and storing values of the matching networks. In some embodiments, the method comprises determining whether an output power level of the individual RF transceiver chiplet is substantially equal to the particular power level; recalibrating the output power level in response to determining that the output power level of the individual RF transceiver chiplet is not substantially equal to the particular power level; and storing calibration data of a transmitter of the individual RF transceiver chiplet in response to recalibrating the output power level.

In some embodiments, recalibrating the output power level comprises adjusting a programmable gain control. In some embodiments, the individual RF transceiver chiplet is a first individual RF transceiver, wherein the method further comprises: connecting the first individual RF transceiver chiplet in loopback with a second individual RF transceiver chiplet, which is a neighbor of the first individual RF transceiver via integrated RF switches; and inserting a matching network between the first individual RF transceiver chiplet and the second individual RF transceiver chiplet if an impedance of a transmitter of the first individual RF transceiver chiplet is substantially different from an impedance of a receiver of the second individual RF transceiver chiplet.

In some embodiments, the method comprises: increasing an output power of the transmitter of the first individual RF transceiver chiplet; monitoring an output of an analog-to-digital converter of the receiver of the second individual RF transceiver chiplet; and recording the output power of the transmitter of the first individual RF transceiver chiplet at which the output of an analog-to-digital converter reaches full-scale. In some embodiments, the method comprises generating a power map based on the recording of the output power. In some embodiments, the method comprises: transmitting a known bit-stream by the transmitter of the first individual RF transceiver chiplet; monitoring a first bit-stream received by the receiver of the second individual RF transceiver chiplet; reducing the output power of the transmitter of the first individual RF transceiver chiplet; monitoring a second bit-stream received by the receiver of the second individual RF transceiver chiplet; computing a bit-error rate of the receiver based on the first bit-stream and the second bit-stream; and recording a sensitivity of the receiver based on the bit-error rate.

The disclosed methods and apparatuses may have various benefits. One benefit may relate to matching a number of antennas using one component. Another benefit may relate to digital control of phase angles for beamforming for millimeter waves. Yet another benefit may relate to system miniaturization for 5G and/or Advanced Driver-Assistance System (ADAS) radar components. Another benefit may relate to combination of through-semiconductor vias (e.g., through-silicon vias) with RF chains, which may simplify system design. Still another benefit may relate to combination of active semiconductor interposers with RF, which may facilitate or enable over-the-air updates to a system (see U.S. patent application Ser. No. 16/320,462 entitled "Over-The-Air Hardware Update" and filed on Jan. 24, 2019).

In the following description, numerous details are discussed to provide a more thorough explanation of embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical, mechanical, or magnetic connection between the things that are connected, without any intermediary devices.

The term "coupled" means either a direct electrical, mechanical, or magnetic connection between the things that are connected or an indirect connection through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, electromagnetic signal, optical signal, magnetic signal, or data/clock signal. The meaning of "a," "an," and "the" include plural references. The meaning of "in" includes "in" and on.

The terms "substantially," "close," "approximately," "near," and "about" generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking, or in any other manner.

It is to be understood that the terms so used are interchangeable under appropriate circumstances such that the embodiments of the invention described herein are, for example, capable of operation in other orientations than those illustrated or otherwise described herein.

The terms "left," "right," "front," "back," "bottom," "over," "under," and the like in the description and in the claims, if any, are used for descriptive purposes and not necessarily for describing permanent relative positions. For example, the terms "over," "under," "front side," "back side," "top," "bottom," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

Here, the term "interconnect" refers to a communication link, or channel, between two or more points or nodes. It may comprise one or more separate conduction paths such as wires, vias, waveguides, passive components, and/or active components. It may also comprise a fabric.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. The term "backend" also refers to the later processing of a wafer where metal layers and vias are formed on top of the result of "frontend" processing, as well as to the resulting metal. Occasionally the term "far backend" is used to refer to the deposition of very large and/or thick redistribution layer(s) ("RDL") on top of the "backend" layers, as well as to refer to the resulting metals. This type of processing may be done inside a semiconductor fab or as part of the packaging process.

Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example). The term "frontend" may also refer to the initial processing of a wafer when transistors are formed on the silicon, as well as to the result of that formation. It may include the lowest metal layers which are generally most lithographically challenging.

Here the term "dielet" or "chiplet" generally refers to a physically distinct semiconductor die, typically connected to an adjacent die in a way that allows the fabric across a die boundary to function like a single fabric rather than as two distinct fabrics. Thus at least some dies may be dielets.

FIG. 1A illustrates a heterogeneously integrated circuit 1000 (or system 1000) with an active semiconductor interposer containing Radio Frequency (RF) signal chains and an RF built-in self-test mechanism, in accordance with some embodiments of the disclosure. FIGS. 1B-E illustrate various portions 1020, 1030, 1040, and 1050, respectively of heterogeneously integrated circuit 1000. System 1000 may comprise an active semiconductor interposer chip 100, a substrate containing an antenna array 200, a plurality of chiplets or dielets including chiplet 300 and additional chiplet(s) 301, and a heat sink and RF shield 400, in accordance with some embodiments of the disclosure.

In some embodiments, active silicon interposer 100 may include active radio functions, and may include an RF signal chain 101 and/or a built-in self-test 102 (among other functions). In some embodiments, RF signal chain 101 includes RF receiver (Rx) chain, RF transmitter (Tx) chain, and switch coupled to them. Active silicon interposer 100 may optionally have through-semiconductor vias.

In some embodiments, active silicon interposer 100 may comprise a built-in matching network circuitry. For some embodiments, active silicon interposer 100 may comprise an RF front-end function circuitry more suitable for active silicon interposer 100 (instead of, for example, being included in a chiplet). In some embodiments, active silicon interposer 100 may comprise a control mechanism for phase control and/or matching control (e.g., for phase-control circuitry and/or matching network circuitry). For some embodiments, active silicon interposer 100 may comprise circuitry 102 for a built-in self-test algorithm.

In some embodiments, substrate 200 (e.g., package substrate or laminate) may include an array of antennas (e.g., antenna 201 and others) that may be used for beamforming, for example by controlling a phase of incoming waves through RF signal chain 101 in the interposer. RF signal chain 101 may in turn include tunable matching network circuitry, phase control circuitry, low-noise amplifier circuitry, and/or radio switch circuitry.

In some embodiments, antenna 201 may comprise one or more directional or omnidirectional antennas, including monopole antennas, dipole antennas, loop antennas, patch antennas, microstrip antennas, coplanar wave antennas, or other types of antennas suitable for transmission of Radio Frequency (RF) signals. In some multiple-input multiple-output (MIMO) embodiments, Antenna(s) 201 are separated to take advantage of spatial diversity.

In some embodiments, chiplet 300 may include a number of RF transceivers 311, 315 (Xcvr1 through Xvcr n, where 'n' is an integer). Each transceiver includes receivers (e.g., RF Rx 1) and transmitters (e.g., RF Tx 1) that can be used for radio communication and/or radio detection and range (radar) applications. Radio beam formation is a valuable function in millimeter-wave designs that are typically used in 5G and higher telecommunication protocols, as well as 77 gigahertz (GHz) radars used in automotive applications. In some embodiments, RF silicon chiplet 300 are attached to heat sink or RF shield 400 via a thermal bond. Any suitable material may be used for thermal bond.

Figure 2:
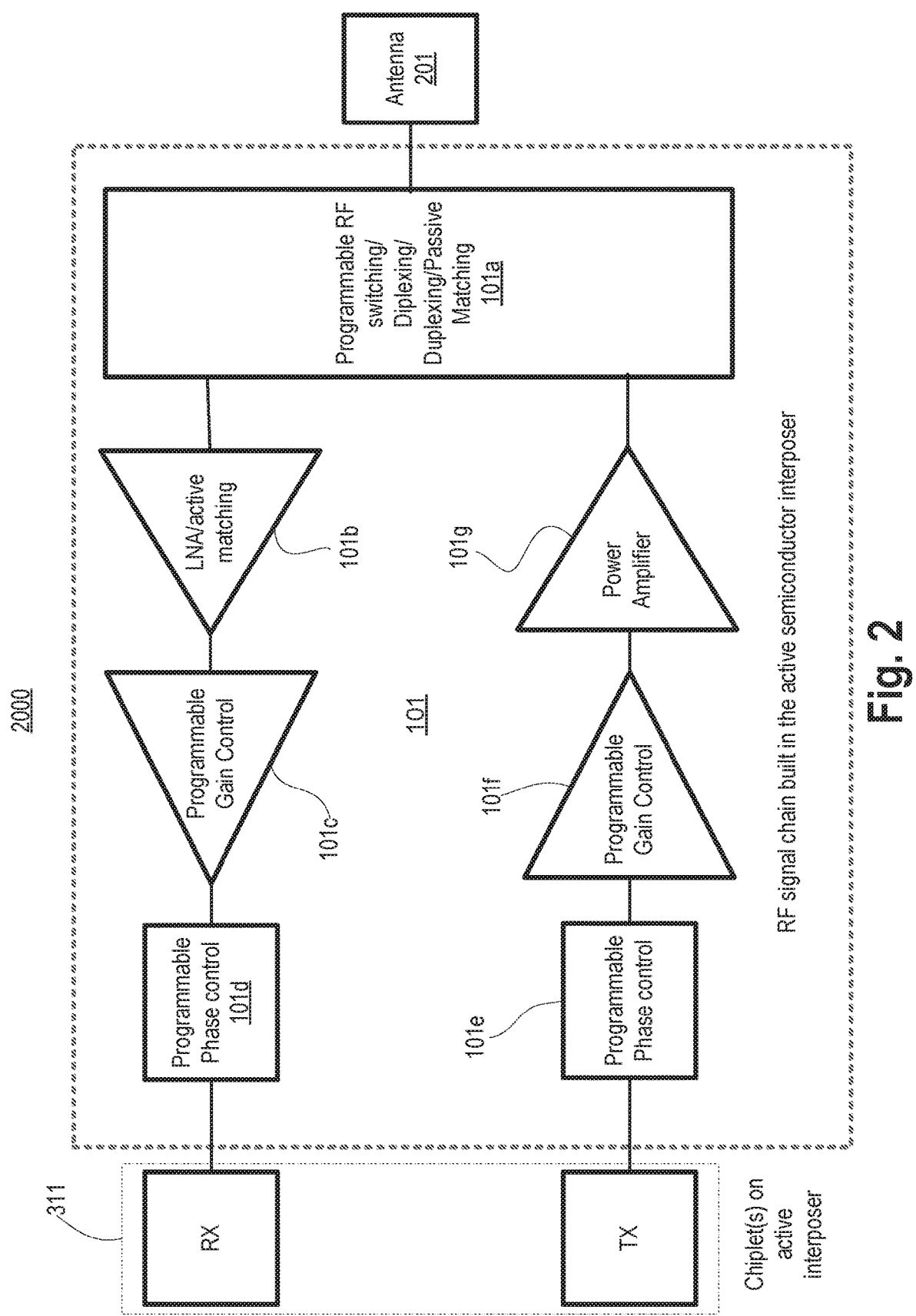
FIG. 2 illustrates an implementation block diagram for an RF signal chain in an active interposer, in accordance with some embodiments of the disclosure.

FIG. 2 illustrates an implementation block diagram 2000 for RF signal chain 101 in active interposer 100, in accordance with some embodiments of the disclosure. In some embodiments, RF signal chain 101 comprises circuitry 101a for programmable RF switching, diplexing, and/or duplexing RF signal from antenna 201. In various embodiments, circuitry 101a provides the flexibility of RF signal routing by incorporating an RF switch, combiner, splitter, and/or duplexer. A programmable antenna switch may control a signal path direction (e.g., to a receiver path or transmitter path). In some embodiments, circuitry 101a includes passive matching devices (e.g., resistors, capacitors, etc.).

In some embodiments, the RF Rx chain of RF signal chain 101 includes low noise amplifier (LNA) and/or active matching circuitry 101b, programmable gain control circuitry 101c, and programmable phase control circuitry 101d. In some embodiments, the output of programmable phase control circuitry 101d is received by Rx of RF Xcvr (e.g., RF Xcvr1 311). For the receive path, LNA and/or active matching 101b followed by programmable gain control 101c and phase control 101d are used for optimizing received signal strength as well as for demodulation of a signal.

In some embodiments, the RF Tx chain (e.g., transmit path) of RF signal chain 101 includes programmable phase control 101e, programmable gain control 101f, and power amplifier (PA) 101g. In some embodiments, the output of Tx of the RF Xcvr (e.g., RF Xcvr1 311) is received by programmable phase control 101e. Any or all of the signal chain elements may include programmable elements that may be controlled by a built-in self-test block.

Figure 3:
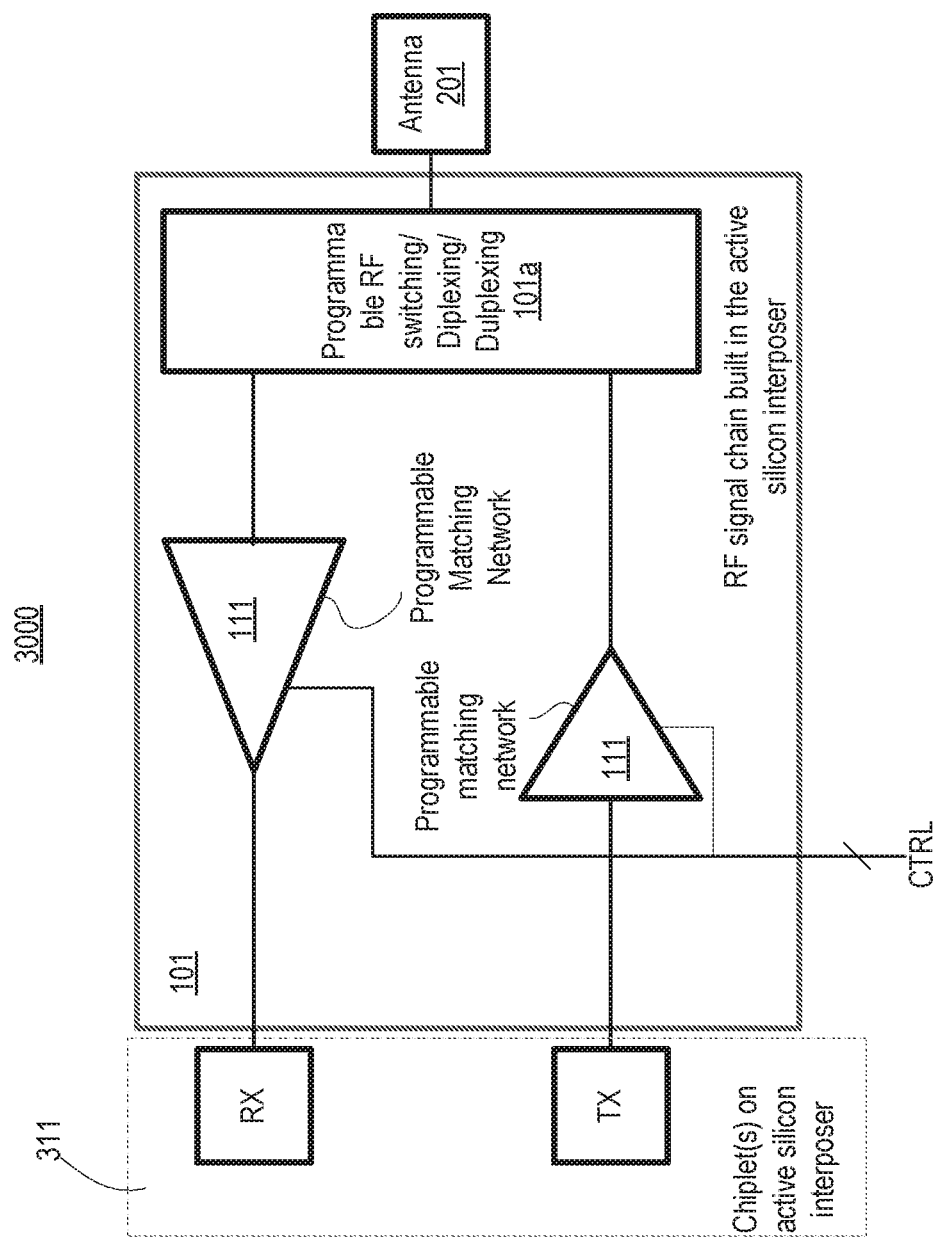
FIG. 3 illustrates an alternate implementation block diagram for an RF signal chain in the active interposer, in accordance with some embodiments of the disclosure.

FIG. 3 illustrates an alternate implementation block diagram 3000 for RF signal chain 101 in active interposer 100, in accordance with some embodiments of the disclosure. Compared to implementation block diagram 2000, here the signal chain may merely include programmable matching 111, one for the transmit path and one for the receive path. In some embodiments, alternate implementation 3000 may use matching on a Transmit (Tx) side and eliminate an antenna switch.

In some embodiments, another implementation of RF signal chain 101 may have an antenna switch to select a signal path direction for Receive (Rx) or Tx path. The Receive path and/or the Transmit path may include programmable matching network 111, which may be controlled through a control port by a built-in self-test block.

Figure 4:
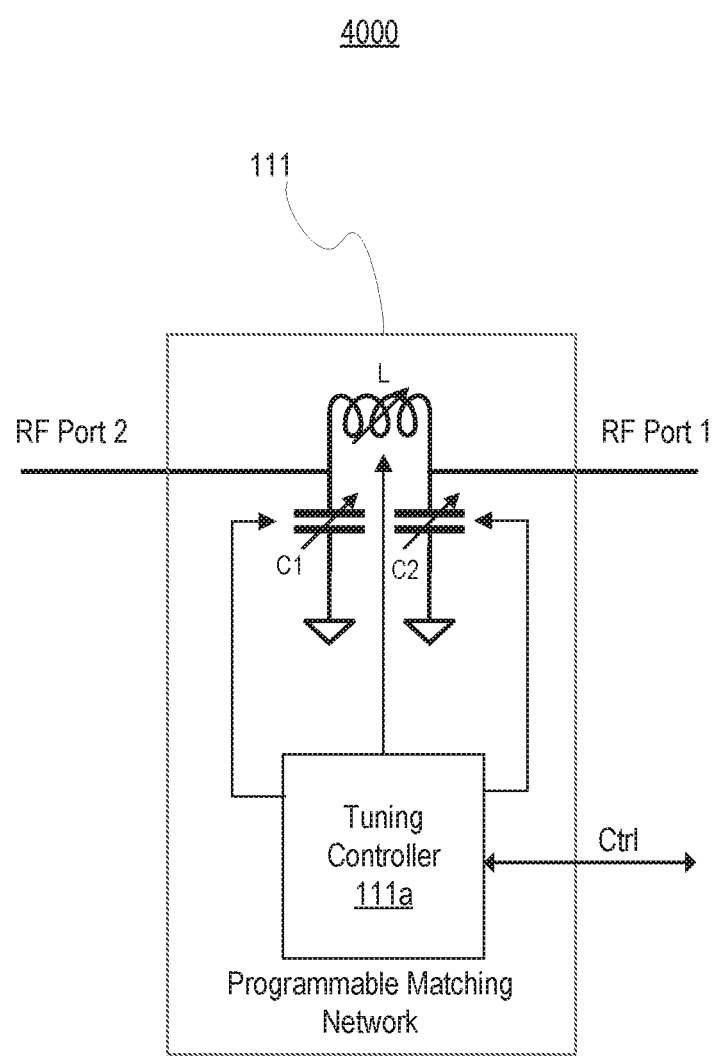
FIG. 4 illustrates an example implementation of a programmable matching network using varactors and tunable inductors, in accordance with some embodiments of the disclosure.

FIG. 4 illustrates example implementation 4000 of a programmable matching network 111 using varactors and tunable inductors, in accordance with some embodiments of the disclosure. In various embodiments, a programmable matching networking for RF Port 1 and Port 2 may comprise variable or fixed capacitors C1, C2 and/or variable or fixed inductors L. A tuning controller 111a may generate a desirable stimulus to vary values of one or more capacitors C1, C2, or one or more inductors L to adjust matching properties based on instructions from a built-in test block through a control (Ctrl) port. In some embodiments, the capacitors are implemented as discrete devices, active transistors configured as capacitors, ferroelectric capacitors, metal-insulator-metal (MIM) capacitors, or a combination of them.

Figure 5:
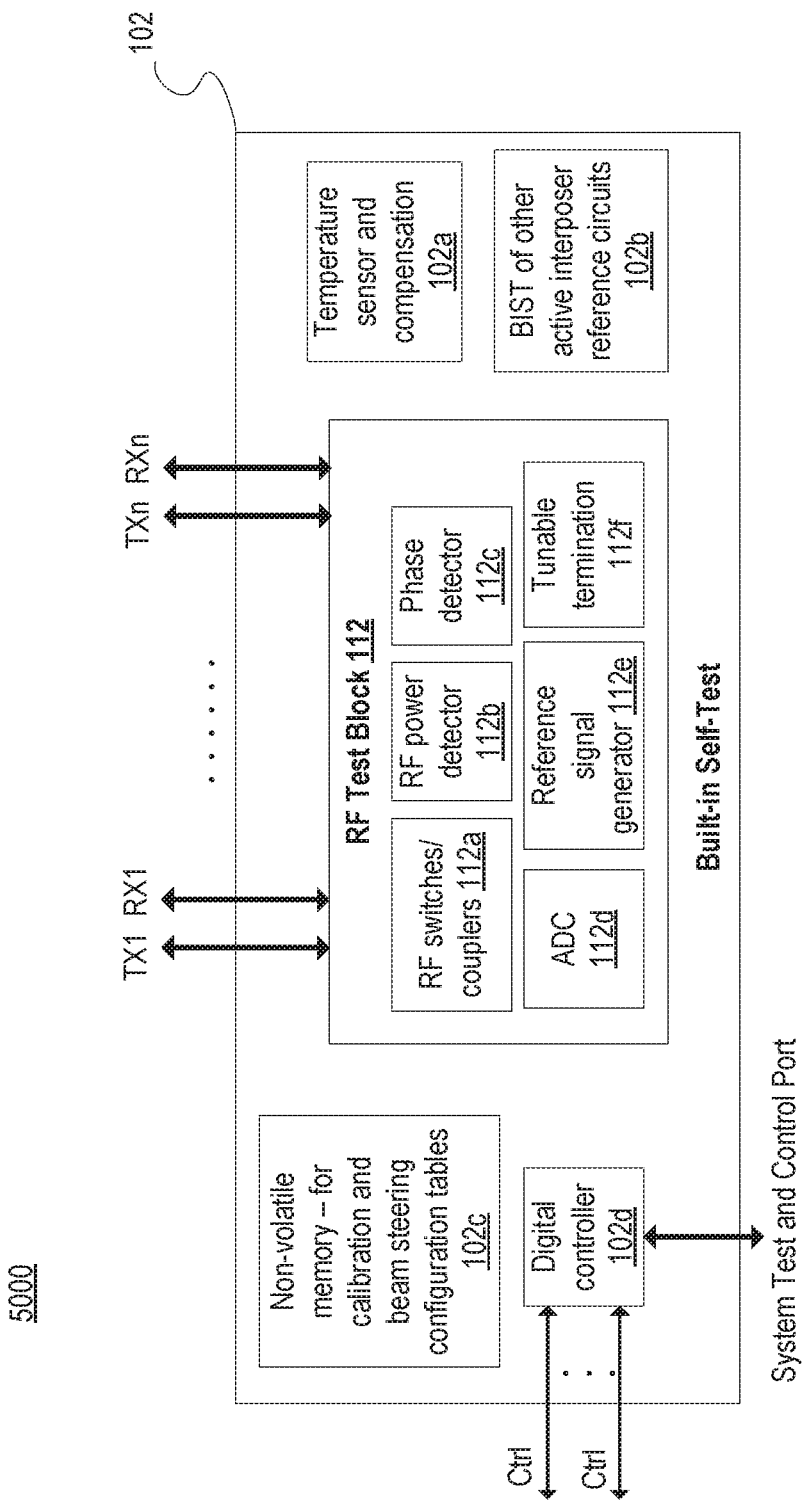
FIG. 5 illustrates a block diagram of a built-in self-test function including an RF Test Block, in accordance with some embodiments of the disclosure.

FIG. 5 illustrates a block diagram 5000 of built-in self-test circuitry 102 including RF Test Block 112, in accordance with some embodiments of the disclosure. In some embodiments, built-in self-test circuitry 102 may include temperature sensors and compensation circuitry 102a, built-in self-test (BIST) for other circuits 102b, non-volatile memory (e.g., to store configuration) 102c, a digital controller 102d, and RF test block 112. In some embodiments, temperature sensor 102a comprises diode(s) to sense temperature of various components of system 1000. In some embodiments, BIST 102b is used to test functionality of other active interposer reference circuits. In some embodiments, non-volatile memory 102c includes memories such as magnetic random-access memory (MRAM), ferroelectric memory (FeRAM), NAND flash memory, NOR flash memory, resistive RAM (ReRAM), or phase change memory (PCM), etc. In some embodiments, non-volatile memory 102c is used for storing calibration and beam steering configuration tables. In some embodiments, digital controller 102d receives control signal (Ctrl) from RF signal chains 111 and along with system test instructions from a control port.

In some embodiments, RF test block 112 may work in conjunction with non-volatile memory 102c and controller 102d. In some embodiments, RF test block 112 comprises RF switches and/or couplers 112a, RF power detector 112b, phase detector 112c, analog-to-digital converter 112d, reference signal generator 112e, and tunable termination 112f. In some embodiments, RF test block 112 may be connected with signal chains (TX1, RX1, through TXn, RXn) and may test those in a variety of manners.

In various embodiments, built-in self-test block 102 may facilitate and/or allow: (1) lowering testing cost of a packaged module by reducing test time and/or a complexity of production RF test equipment; (2) in-field testing and/or re-calibration of RF Transceiver chiplets and/or RF system e.g. phased array; (3) increasing a configuration speed of phased array systems with pre-set configurations of amplitude/phase values of beam steering tables; and/or (4) providing deeper visibility about the performance of individual RF Transceiver chiplets.

Figure 6:
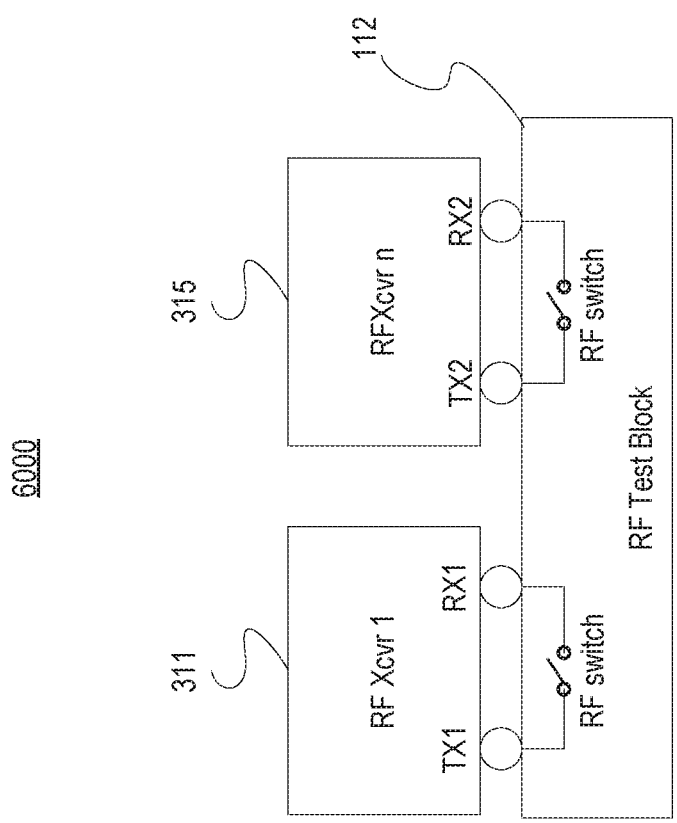
FIG. 6 illustrates a first example implementation of the RF Test Block, which includes simple loop back, in accordance with some embodiments of the disclosure.
Figure 7:
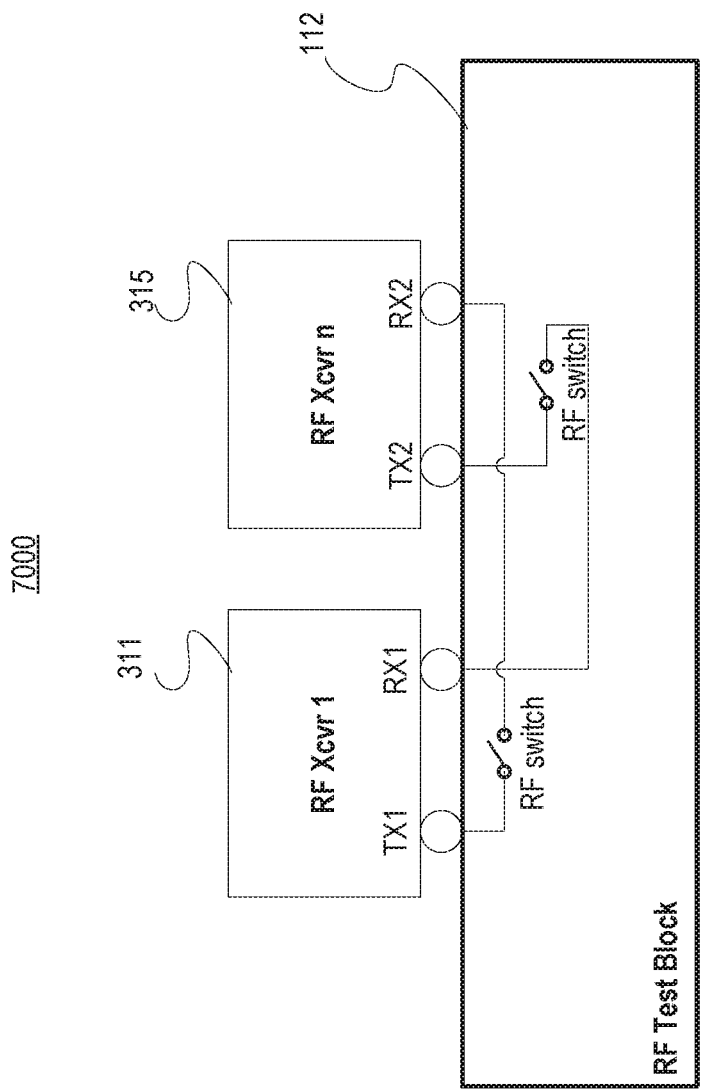
FIG. 7 illustrates a second example implementation of the RF Test Block, which includes across transceiver loop, in accordance with some embodiments of the disclosure.

FIG. 6 illustrates a first example implementation 6000 of the RF Test Block which includes a loop back mechanism, in accordance with some embodiments of the disclosure. FIG. 7 illustrates a second example implementation 7000 of the RF Test Block which includes an across transceiver loop mechanism, in accordance with some embodiments of the disclosure. With respect to FIG. 6, in various embodiments, first example implementation 6000 of the built-in self-test may enable a more complete loopback test of RF transceivers in one or multiple chiplets by connecting Rx/Tx pins of transceivers 311, 315 using integrated switches (RF switches). For example, TX1 pin is connectable to RX1 pin via an RF switch, and RX2 pin is connectable to TX2 pin via another RF switch. This design may facilitate and/or allow inclusion of a power amplifier (PA) and/or an LNA in the test when compared to loopback tests that may generally be integrated in individual transceivers which connect the input of the PA to the output of the LNA internally. If a transceiver operates in half-duplex mode, a loopback test may be done with a neighboring transceiver as shown in FIG. 7. In implementation 7000 TX1 of one RF transceiver 311 is connectable to RX2 of another RF transceiver 315 via a first RF switch, while RX1 of one RF transceiver 311 is connectable to TX2 of another RF transceiver 315 via a second RF switch.

Figure 8:
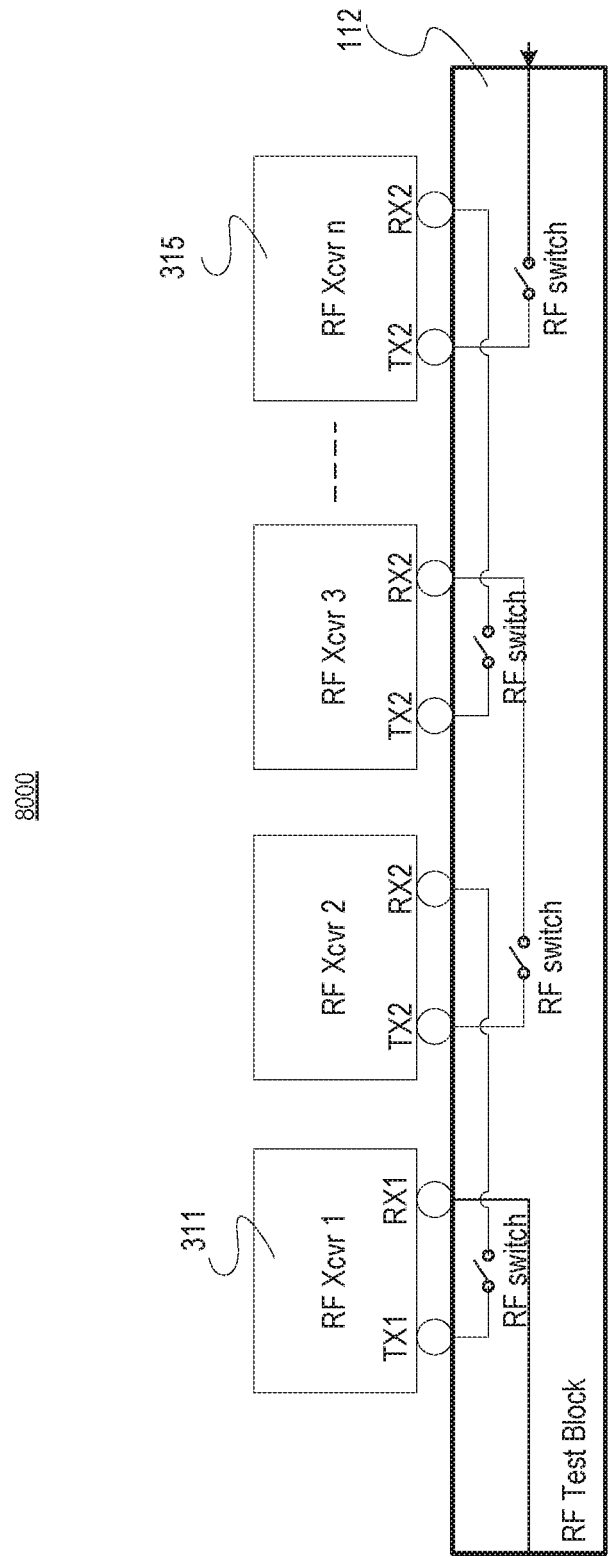
FIG. 8 illustrates a third example implementation of the RF Test Block, in accordance with some embodiments of the disclosure.

FIG. 8 illustrates a third example implementation 8000 of the RF Test Block. Note the daisy chain of transceivers being tested, in accordance with some embodiments of the disclosure. In various embodiments, another implementation of an RF Test Block may have several transceivers which may be connected in a daisy chain. This mode may facilitate and/or enable a fast go/no-go indication during a production test performed before functional testing or calibration. In some embodiments, an Rx port of an RF transceiver 1 may be connected to an external RF signal generator, or to a Tx port of an RF transceiver N to close the test chain.

Figure 9:
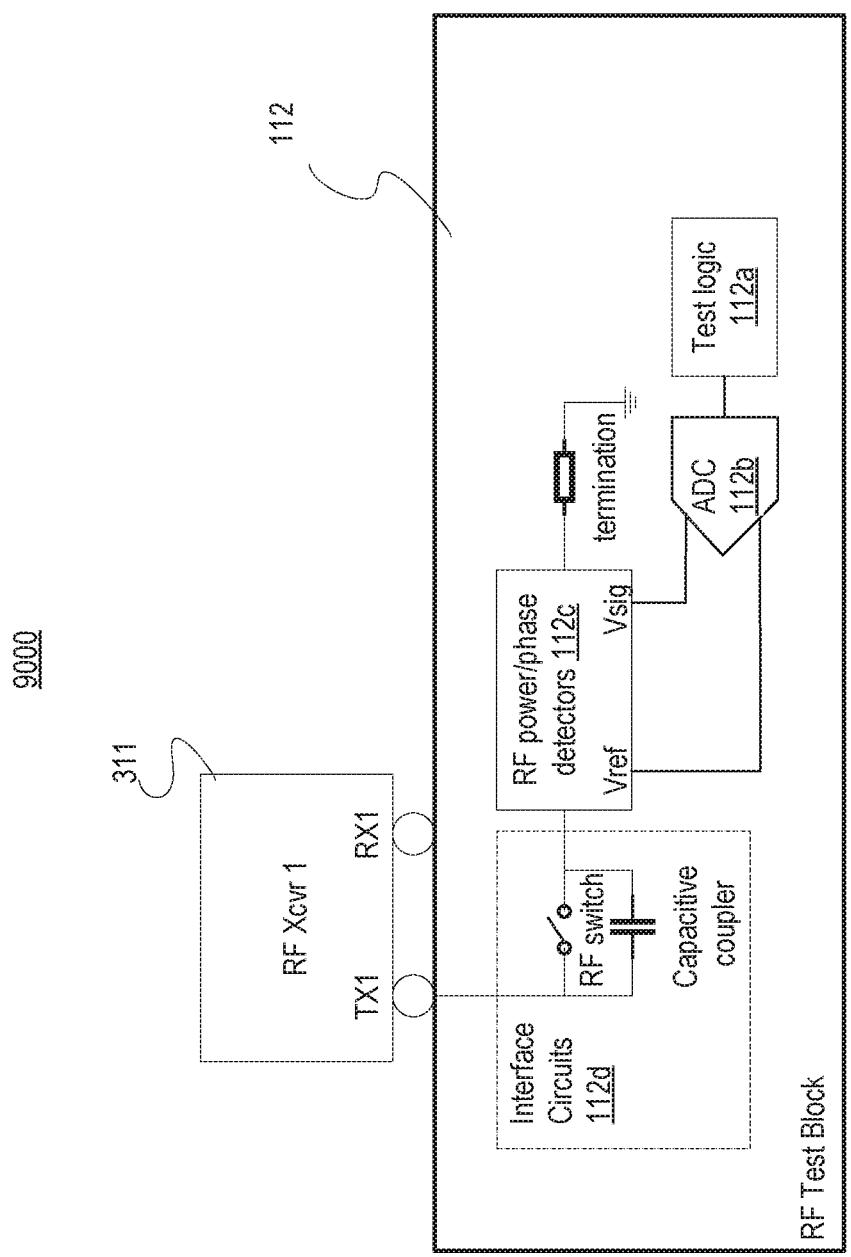
FIG. 9 illustrates a fourth example implementation of the RF Test Block, in accordance with some embodiments of the disclosure.

FIG. 9 illustrates a fourth example implementation 9000 of the RF Test Block, in accordance with some embodiments of the disclosure. In some embodiments, RF Test Block 112 comprises test logic 112a, analog-to-digital converter (ADC) 112b, RF power/phase detector 112c, and interface circuits 112d. In some embodiments, implementation 9000 may be used to tune matching networks 111 using test logic 112a. In some embodiments, an implementation for the built-in self-test (BIST) may use an integrated RF power detector 112, followed by ADC 112b.

ADCs are apparatuses that convert continuous physical quantities (e.g., voltages) to digital numbers that represent the amplitude of the physical quantities. Any suitable ADC may be used to implement ADC 112b. For example, ADC 112b is one of: direct-conversion ADC (or flash ADC), two-step flash ADC, successive-approximation ADC (SAR ADC), ramp-compare ADC, Wilkinson ADC, integrating ADC, delta-encoded ADC or counter-ramp, pipeline ADC (also called subranging quantizer), sigma-delta ADC (also known as a delta-sigma ADC), time-interleaved ADC, ADC with intermediate FM stage, or time-stretch ADC.

A plurality of the blocks (112), up to and including all of the blocks (112), may be tuned and/or calibrated ahead of an RF system assembly. In some embodiments, interface circuit 112d from a chiplet Tx port to a measurement circuit may either be resistively coupled (e.g., a switch) or capacitively coupled to one or more measurement circuits.

With respect to FIGS. 1A-9, in various embodiments, one or more RF signals may be routed from a first component mounted on a substrate (e.g., substrate 200) to a second component mounted on the substrate. For example, a first component may include radio circuitry, and a second component may include Tx filtering circuitry and/or Rx filtering circuitry. One or more embedded RF switches may then connect the filter circuitries to an antenna (e.g., of the radio circuitry). Such a design may advantageously facilitate self-testing.

Figure 10A:
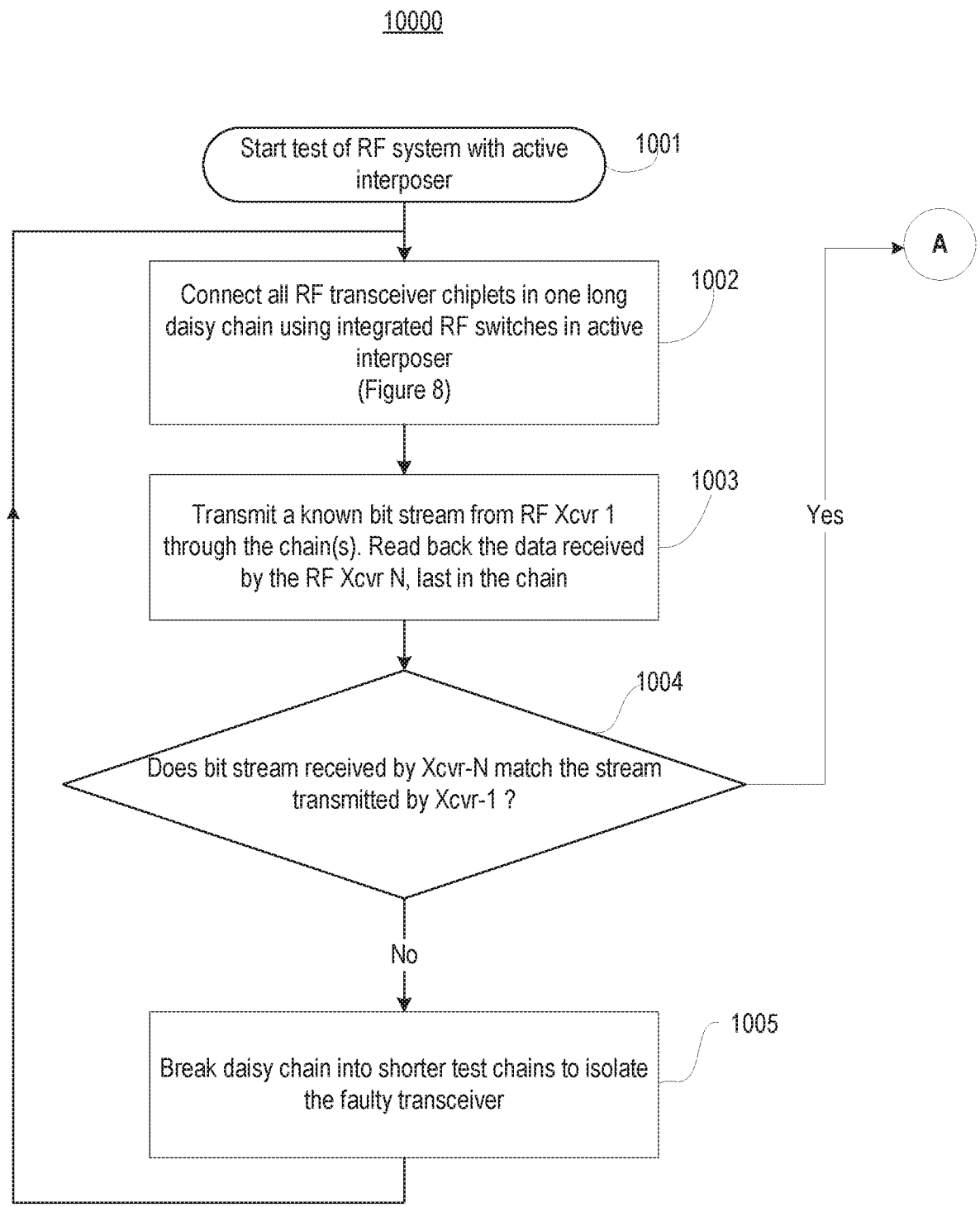
FIGS. 10A-10C illustrate a test flow chart, in accordance with some embodiments.
Figure 10B:
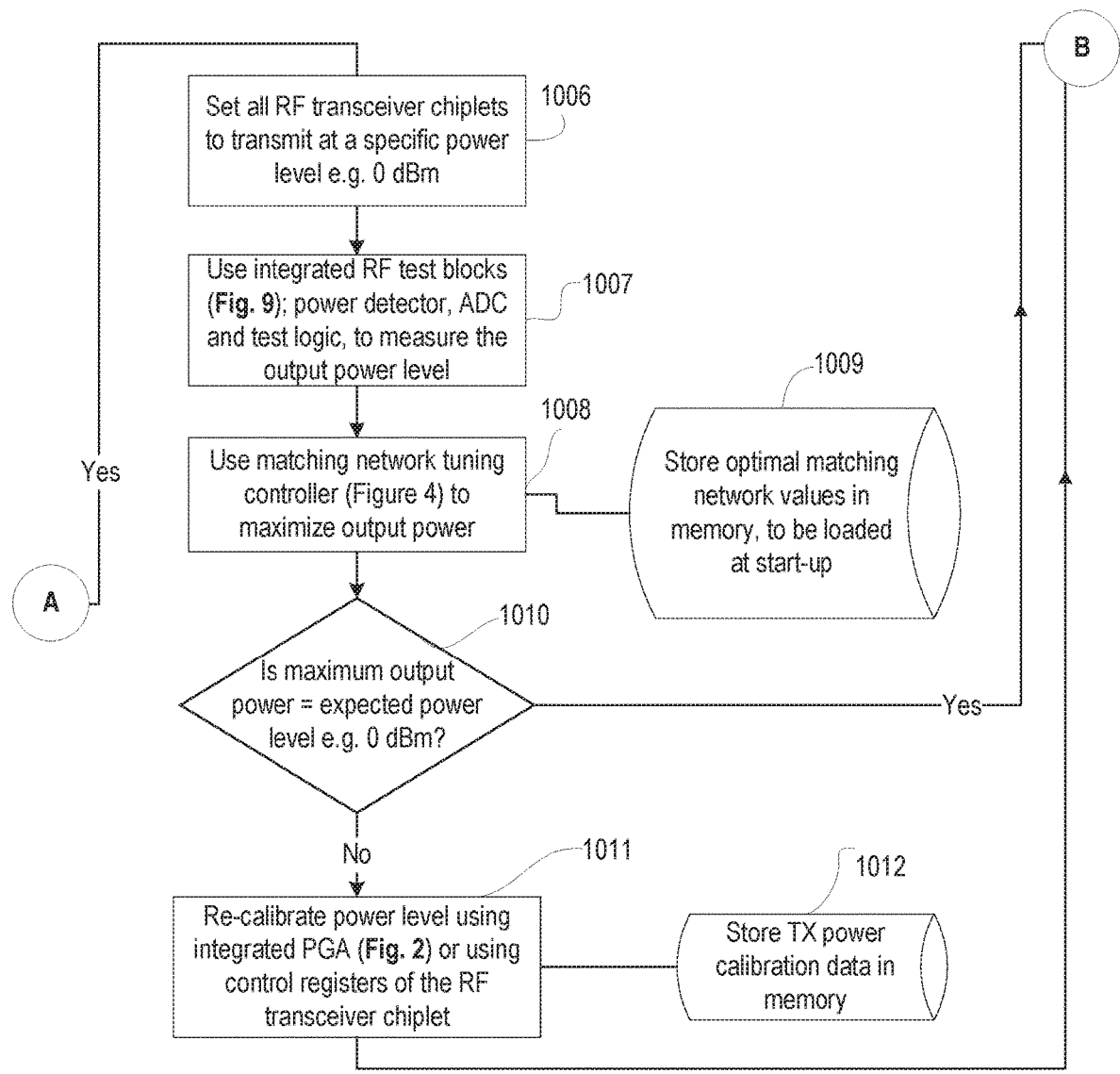
Figure 10C:
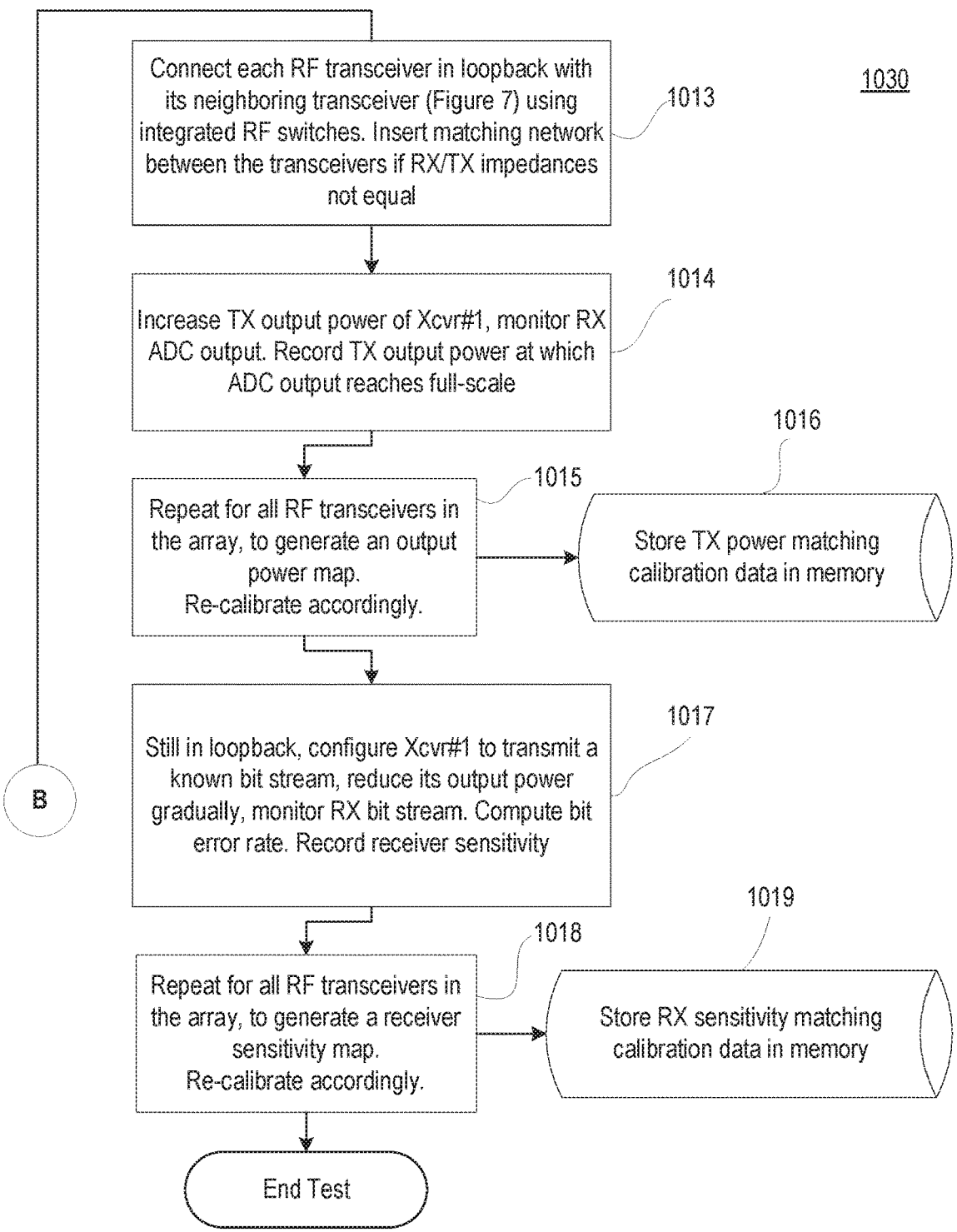

FIGS. 10A-10C illustrate a test flow chart 10000, in accordance with some embodiments. While various blocks are illustrated in a particular order, the order may be modified. For example, some blocks may be performed in parallel while some blocks may be performed before others. The flow extends between multiple figures and is connected by transition indicators 'A' and 'B'.

Flowchart 10000 works with other implementations of chiplet coupling. In various embodiments, implementations of the test flow may pertain to an RF active interposer. A test may start with a quick go/no-go test of a complete array of RF chiplets utilizing integrated RF switches to connect the chiplets in a daisy chain. This may be followed by a Tx power measurement and/or calibration of individual transceiver chiplets using integrated test blocks, like the RF power detector. Finally, a mismatch compensation algorithm may calibrate out any differences in Tx/Rx performance of chiplets, to improve an overall beamforming accuracy of an antenna array.

At block 1001, test of RF system begins with active interposer 100. At block 1002, RF transceiver chiplets (e.g., 311, 315) are connected in a daisy chain configuration using integrated RD switches in active interposer 100 as discussed with reference to FIG. 8. Referring back to FIG. 10A, at block 1003, a known bit stream is transmitted from RF transceiver 311 (e.g., RF Xcvr1) to RF transceiver 315 (e.g., RF Xcvr n) through the daisy chain. The data received by the receiver Tx of the last chain (e.g., RF Tx n) of chiplet 315 is then read back. At block 1004 a determination is made about the correctness of the received data. If the bit stream received by last RF receiver (e.g., RF Rx n) of chiplet 315 matches with the bit stream transmitted by the first RF transmitter (e.g., RF Tx 1) of chiplet 311, then the process proceeds to block 1006 as indicated by transition letter 'A'. If the bit stream received by last RF receiver (e.g., RF Rx n) of chiplet 315 does not match with the bit stream transmitted by the first RF transmitter (e.g., RF Tx 1) of chiplet 311, the process proceeds to block 1005. At block 1005, the process of isolating the faulty transmitter begins by breaking the daisy chain into shorter test chains between chiplets. The process is then repeated from block 1002.

At block 1006, after a match of the bit stream is confirmed, the process proceeds to setting all RF transceiver chiplet components (e.g., RD Tx1 through RF Tx n) to transit at a specific power level (e.g., 0 dBm). The process then proceeds to block 1007. At block 1007, integrated RF test block 112 of BIST 102 is applied to measure the output power level transmitted by the RF transceiver chiplet components (e.g., RD Tx1 through RF Tx n). For example, RF switch couplers 112a, RF power detector 112b, phase detector 112c, ADC 112d, reference signal generator 112e, and/or tunable termination 112f (as illustrated in FIG. 9) are used to measure the output power level. The process then proceeds to block 1008 where matching network tuning controller 4000 (or 111) is used to maximize the output power. The optimal matching network values (e.g., values for capacitances C1, C2, and/or inductance L) are stored in memory to be loaded at start-up of a processor using system 1000. The process continued to block 1010.

At block 1010, a determination is made regarding the maximum output power relative to an expected power level (e.g., 0 dBm). If the maximum output power is substantially equal to the expected power level, the process proceeds to block 1013 as indicated by transmission identifier 'B'. If the maximum output power is not substantially equal to (e.g., is substantially less or greater than) the expected power level, the process proceeds to block 1011. At block 1011, the power level is re-calibrated using the programmable gain control 101c or using control registers of the RF transceiver chiplet (e.g., chiplets 311 through 315). At block 1012, the transmit power calibration data is stored in memory. The process then proceeds to block 1013 as indicated by transmission identifier 'B'.

At block 1013, each RF transceiver in the loopback (e.g., daisy chain) with its neighboring transceiver (as shown in FIG. 7) is connected using the integrated RF switches. In some embodiments, to achieve maximum power transfer, matching networks are inserted between the transceivers if it is determined that the RX and TX impedances (e.g., Tx1 and Rx2) are not equal or are substantially unequal. The process then proceeds to block 1014. At block 1014, transmitter (e.g., Tx1 of transceiver 311) output power is increased, and the output of the ADC at the Rx (e.g., Tx2 of transceiver 315) is monitored. In some embodiments, the Tx output power at which the ADC output at the receiver reaches full-scale is recorded and saved in memory.

At block 1015, the process of block 1014 is repeated for all RF transceivers in the array to generate an output power map. Various control parameters are adjusted to calibrate or re-calibrate the transceivers to achieve maximum output power transfer. For example, termination impedances, capacitance C1, C2, and/or inductance L of matching network 111 are tuned such that each transceiver achieves maximum power transfer. At block 1016, the power matching calibration data is stored in memory.

At block 1017, while still in loopback, the RF transceiver (e.g., Xcvr1 311) is configured to transmit a known bit stream and reduce its output power gradually. For each transmission of the bit stream and for each case of reducing the output power, the bit stream at the receiver is monitored. As the output power is reduced, the error rate at the receiver may increase. This error rate is a measure of the sensitivity of the receiver. The error rate is recorded and saved in memory, in accordance with some embodiments. At block 1018, the process of configuring the RF transceiver as discussed with reference to block 1017 is repeated for all RF transceivers (e.g., 1 through n) in the array to generate a receiver sensitivity map. For each RF transceiver, one or more control parameters are adjusted or calibrated to achieve maximum output power transfer. For example, termination impedances, capacitance C1, C2, and/or inductance L of matching network 111 are tuned such that each transceiver achieves maximum power transfer with minimum error rate. At block 1019, the receiver sensitivity with calibration is stored in memory.

Figure 11:
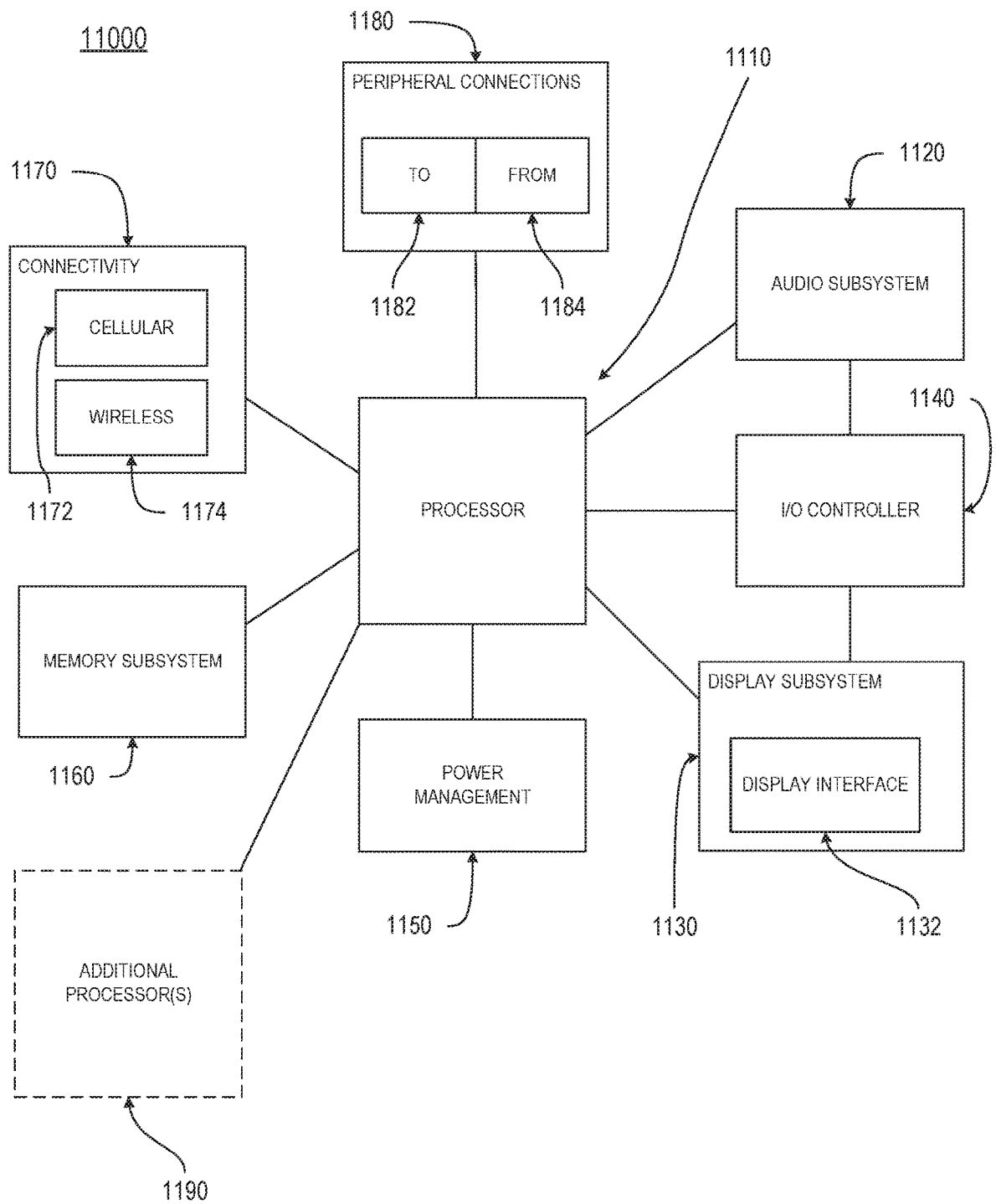
FIG. 11 illustrates a computing device with an integrated circuit having an active semiconductor interposer, in accordance with some embodiments of the disclosure.

FIG. 11 illustrates a computing device with an integrated circuit having an active semiconductor interposer, in accordance with some embodiments of the disclosure. Computing device 11000 may be a computer system, a System-on-a-Chip (SoC), a tablet, a mobile device, a smart device, or a smart phone with an integrated circuit having an active semiconductor interposer, in accordance with some embodiments of the disclosure. It will be understood that certain components of computing device 11000 are shown generally, and not all components of such a device are shown FIG. 11. Moreover, while some of the components may be physically separate, others may be integrated within the same physical package, or even on the same physical silicon die. Accordingly, the separation between the various components as depicted in FIG. 11 may not be physical in some cases, but may instead be a functional separation. It is also pointed out that those elements of FIG. 11 having the same names or reference numbers as the elements of any other figure can operate or function in any manner similar to that described, but are not limited to such.

In various embodiments, the components of computing device 11000 may include any of a processor 1110, an audio subsystem 1120, a display subsystem 1130, an I/O controller 1140, a power management component 1150, a memory subsystem 1160, a connectivity component 1170, one or more peripheral connections 1180, and one or more additional processors 1190. In some embodiments, processor 1110 may include an integrated circuit having an active semiconductor interposer, in accordance with some embodiments of the disclosure. In various embodiments, however, any of the components of computing device 11000 may include an integrated circuit having an active semiconductor interposer, in accordance with some embodiments of the disclosure. In addition, one or more components of computing device 11000 may include an interconnect fabric having a plurality of ports, such as a router, a network of routers, or a Network-on-a-Chip (NoC).

In some embodiments, computing device 11000 may be a mobile device which may be operable to use flat surface interface connectors. In one embodiment, computing device 11000 may be a mobile computing device, such as a computing tablet, a mobile phone or smart-phone, a wireless-enabled e-reader, or other wireless mobile device. The various embodiments of the present disclosure may also comprise a network interface within 1170 such as a wireless interface so that a system embodiment may be incorporated into a wireless device, for example a cell phone or personal digital assistant.

Processor 1110 may be a general-purpose processor or CPU (Central Processing Unit). In some embodiments, processor 1110 may include one or more physical devices, such as microprocessors, application processors, microcontrollers, programmable logic devices, or other processing means. The processing operations performed by processor 1110 may include the execution of an operating platform or operating system on which applications and/or device functions may then be executed. The processing operations may also include operations related to one or more of the following: audio I/O; display I/O; power management; connecting computing device 11000 to another device; and/or I/O (input/output) with a human user or with other devices.

Audio subsystem 1120 may include hardware components (e.g., audio hardware and audio circuits) and software components (e.g., drivers and/or codecs) associated with providing audio functions to computing device 11000. Audio functions can include speaker and/or headphone output as well as microphone input. Devices for such functions can be integrated into computing device 11000, or connected to computing device 11000. In one embodiment, a user interacts with computing device 11000 by providing audio commands that are received and processed by processor 1110.

Display subsystem 1130 may include hardware components (e.g., display devices) and software components (e.g., drivers) that provide a visual and/or tactile display for a user to interact with computing device 11000. Display subsystem 1130 may include a display interface 1132, which may be a particular screen or hardware device used to provide a display to a user. In one embodiment, display interface 1132 includes logic separate from processor 1110 to perform at least some processing related to the display. In some embodiments, display subsystem 1130 includes a touch screen (or touch pad) device that provides both output and input to a user.

I/O controller 1140 may include hardware devices and software components related to interaction with a user. I/O controller 1140 may be operable to manage hardware that is part of audio subsystem 1120 and/or display subsystem 1130. Additionally, I/O controller 1140 may be a connection point for additional devices that connect to computing device 11000, through which a user might interact with the system. For example, devices that can be attached to computing device 11000 might include microphone devices, speaker or stereo systems, video systems or other display devices, keyboard or keypad devices, or other I/O devices for use with specific applications such as card readers or other devices.

As mentioned above, I/O controller 1140 can interact with audio subsystem 1120 and/or display subsystem 1130. For example, input through a microphone or other audio device can provide input or commands for one or more applications or functions of computing device 11000. Additionally, audio output can be provided instead of, or in addition to, display output. In another example, if display subsystem 1130 includes a touch screen, the display device may also act as an input device, which can be at least partially managed by I/O controller 1140. There can also be additional buttons or switches on computing device 11000 to provide I/O functions managed by I/O controller 1140.

In some embodiments, I/O controller 1140 manages devices such as accelerometers, cameras, light sensors or other environmental sensors, or other hardware that can be included in computing device 11000. The input can be part of direct user interaction, and may provide environmental input to the system to influence its operations (such as filtering for noise, adjusting displays for brightness detection, applying a flash for a camera, or other features).

Power management component 1150 may include hardware components (e.g., power management devices and/or circuitry) and software components (e.g., drivers and/or firmware) associated with managing battery power usage, battery charging, and features related to power saving operation.

Memory subsystem 1160 may include one or more memory devices for storing information in computing device 11000. Memory subsystem 1160 can include nonvolatile memory devices (whose state does not change if power to the memory device is interrupted) and/or volatile memory devices (whose state is indeterminate if power to the memory device is interrupted). Memory subsystem 1160 can store application data, user data, music, photos, documents, or other data, as well as system data (whether long-term or temporary) related to the execution of the applications and functions of computing device 11000.

Some portion of memory subsystem 1160 may also be provided as a non-transitory machine-readable medium for storing the computer-executable instructions (e.g., instructions to implement any other processes discussed herein). The machine-readable medium may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, some embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity component 1170 may include a network interface, such as a cellular interface 1172 or a wireless interface 1174 (so that an embodiment of computing device 11000 may be incorporated into a wireless device such as a cellular phone or a personal digital assistant). In some embodiments, connectivity component 1170 includes hardware devices (e.g., wireless and/or wired connectors and communication hardware) and software components (e.g., drivers and/or protocol stacks) to enable computing device 11000 to communicate with external devices. Computing device 11000 could include separate devices, such as other computing devices, wireless access points or base stations, as well as peripherals such as headsets, printers, or other devices.

In some embodiments, connectivity component 1170 can include multiple different types of network interfaces, such as one or more wireless interfaces for allowing processor 1110 to communicate with another device. To generalize, computing device 11000 is illustrated with cellular interface 1172 and wireless interface 1174. Cellular interface 1172 refers generally to wireless interfaces to cellular networks provided by cellular network carriers, such as provided via GSM or variations or derivatives, CDMA (code division multiple access) or variations or derivatives, TDM (time division multiplexing) or variations or derivatives, or other cellular service standards. Wireless interface 1174 refers generally to non-cellular wireless interfaces, and can include personal area networks (such as Bluetooth, Near Field, etc.), local area networks (such as Wi-Fi), and/or wide area networks (such as WiMax), or other wireless communication.

Peripheral connections 1180 may include hardware interfaces and connectors, as well as software components (e.g., drivers and/or protocol stacks) to make peripheral connections. It will be understood that computing device 11000 could both be a peripheral device to other computing devices (via "to" 1182), as well as have peripheral devices connected to it (via "from" 1184). The computing device 11000 may have a "docking" connector to connect to other computing devices for purposes such as managing content on computing device 11000 (e.g., downloading and/or uploading, changing, synchronizing). Additionally, a docking connector can allow computing device 11000 to connect to certain peripherals that allow computing device 11000 to control content output, for example, to audiovisual or other systems.

In addition to a proprietary docking connector or other proprietary connection hardware, computing device 11000 can make peripheral connections 1180 via common or standards-based connectors. Common types of connectors can include a Universal Serial Bus (USB) connector (which can include any of a number of different hardware interfaces), a DisplayPort or MiniDisplayPort (MDP) connector, a High Definition Multimedia Interface (HDMI) connector, a Firewire connector, or other types of connectors.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: A machine-readable storage media having machine-executable instructions that when executed cause one or more machines to perform a method comprising: coupling RF transceiver chiplets, in an active RF silicon, in a daisy chain configuration; testing the RF transceiver chiplets for transmission error; tuning and/or calibrating a matching network of an individual transceiver chiplet, from among the RF transceiver chiplets, to achieve maximum power transfer; and storing values of the tuned and/or calibrated matching network in memory.

Example 2: The machine-readable storage media of example 1, wherein coupling the RF transceiver chiplets comprises applying or using integrated RF switches in an active interposer to couple the RF transceiver chiplets.

Example 3: The machine-readable storage media of example 1, wherein testing the RF transceiver chiplets for transmission error comprises: transmitting a known bit stream from a first RF transceiver chiplet to a last RF transceiver chiplet in the daisy chain configuration; and comparing the known bit stream with a bit stream received by the last RF transceiver chiplet.

Example 4: The machine-readable storage media of example 3 comprising having machine-executable instructions that when executed cause the one or more machines to perform the method comprising: breaking the daisy chain into a shorter daisy chain in response to determining that the known bit stream does not match with the bit stream received by the last RF transceiver chiplet.

Example 5: The machine-readable storage media of example 3 comprising having machine-executable instructions that when executed cause the one or more machines to perform the method comprising: setting the RF transceiver chiplets to transmit at a particular power level in response to determining that the known bit stream matches with the bit stream received by the last RF transceiver chiplet.

Example 6: The machine-readable storage media of example 5 comprising having machine-executable instructions that when executed cause the one or more machines to perform the method comprising: measuring output power levels of the RF transceiver chiplets; applying matching networks to maximize the output power levels; and storing values of the matching networks.

Example 7: The machine-readable storage media of example 6 comprising having machine-executable instructions that when executed cause the one or more machines to perform the method comprising: determining whether an output power level of the individual RF transceiver chiplet is substantially equal to the particular power level; recalibrating the output power level in response to determining that the output power level of the individual RF transceiver chiplet is not substantially equal to the particular power level; and storing calibration data of a transmitter of the individual RF transceiver chiplet in response to recalibrating the output power level.

Example 8: The machine-readable storage media of example 7, wherein recalibrating the output power level comprises adjusting a programmable gain control.

Example 9: The machine-readable storage media of example 7, wherein the individual RF transceiver chiplet is a first individual RF transceiver, wherein the method comprising: connecting the first individual RF transceiver chiplet in loopback with a second individual RF transceiver chiplet which is a neighbor of the first individual RF transceiver via integrated RF switches; and inserting a matching network between the first individual RF transceiver chiplet and the second individual RF transceiver chiplet if an impedance of a transmitter of the first individual RF transceiver chiplet is substantially different from an impedance of a receiver of the second individual RF transceiver chiplet.

Example 10: The machine-readable storage media of example 9 comprising having machine-executable instructions that when executed cause the one or more machines to perform the method comprising: comprising: increasing an output power of the transmitter of the first individual RF transceiver chiplet; monitoring an output of an analog-to-digital converter of the receiver of the second individual RF transceiver chiplet; and recording the output power of the transmitter of the first individual RF transceiver chiplet at which the output of an analog-to-digital converter reaches full-scale.

Example 11: The machine-readable storage media of example 10 comprising having machine-executable instructions that when executed cause the one or more machines to perform the method comprising: comprising: generating a power map based on the recording of the output power.

Example 12: The machine-readable storage media of example 10 comprising having machine-executable instructions that when executed cause the one or more machines to perform the method comprising: transmitting a known bit-stream by the transmitter of the first individual RF transceiver chiplet; monitoring a first bit-stream received by the receiver of the second individual RF transceiver chiplet; reducing the output power of the transmitter of the first individual RF transceiver chiplet; monitoring a second bit-stream received by the receiver of the second individual RF transceiver chiplet; computing a bit-error rate of the receiver based on the first bit-stream and the second bit-stream; and recording a sensitivity of the receiver based on the bit-error rate.

Example 13: An apparatus comprising: a package substrate comprising an array of antennas; an active interposer coupled to the package substrate; an RF silicon coupled to the active interposer; a heat sink coupled to the RF silicon via a thermal bond, wherein the RF silicon comprises RF transceiver chiplets in a daisy chain configuration, wherein the active interposer includes an RF signal chain configured to: test the RF transceiver chiplets for transmission error; and tune and/or calibrate a matching network of an individual transceiver chiplet, from among the RF transceiver chiplets, to achieve maximum power transfer.

Example 14: The apparatus of example 13 comprising memory store values of the tuned and/or calibrated matching network in memory.

Example 15: The apparatus of claim 13, wherein the RF signal chain comprises integrated RF switches to couple the RF transceiver chiplets.

Example 16: The apparatus of example 13, wherein RF transceiver chiplets includes a first RF transceiver chiplet and a last RF transceiver chiplet in the daisy chain configuration, wherein the first RF transceiver chiplet is to transmit a known bit stream to the last RF transceiver chiplet.

Example 17: The apparatus of example 13 comprises: circuitry to compare the known bit stream with a bit stream received by the last RF transceiver chiplet; and logic to break the daisy chain into a shorter daisy chain in response to a determination that the known bit stream does not match with the bit stream received by the last RF transceiver chiplet.

Example 18: A method comprising: coupling RF transceiver chiplets, in an active RF silicon, in a daisy chain configuration; testing the RF transceiver chiplets for transmission error; tuning and/or calibrating a matching network of an individual transceiver chiplet, from among the RF transceiver chiplets, to achieve maximum power transfer; and storing values of the tuned and/or calibrated matching network in memory.

Example 19: The method of example 18, wherein coupling the RF transceiver chiplets comprises applying or using integrated RF switches in an active interposer to couple the RF transceiver chiplets.

Example 20: The method of example 18, wherein testing the RF transceiver chiplets for transmission error comprises: transmitting a known bit stream from a first RF transceiver chiplet to a last RF transceiver chiplet in the daisy chain configuration; comparing the known bit stream with a bit stream received by the last RF transceiver chiplet; and breaking the daisy chain into a shorter daisy chain in response to determining that the known bit stream does not match with the bit stream received by the last RF transceiver chiplet.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A non-transitory machine-readable storage media having machine-executable instructions that when executed cause one or more machines to perform a method comprising:
    coupling RF transceiver chiplets, in an active RF silicon, in a daisy chain configuration;
    testing the RF transceiver chiplets for transmission error, wherein testing the RF transceiver chiplets comprises transmitting a known bit stream from a first RF transceiver chiplet to a last RF transceiver chiplet in the daisy chain configuration;
    tuning and/or calibrating a matching network of an individual RF transceiver chiplet, from among the RF transceiver chiplets, to achieve maximum power transfer; and
    storing values of the tuned and/or calibrated matching network in memory.

2. The non-transitory machine-readable storage media of claim 1, wherein coupling the RF transceiver chiplets comprises applying or using integrated RF switches in an active interposer to couple the RF transceiver chiplets.

3. The non-transitory machine-readable storage media of claim 1, wherein testing the RF transceiver chiplets for the transmission error comprises:
    comparing the known bit stream with a bit stream received by the last RF transceiver chiplet.

4. The non-transitory machine-readable storage media of claim 3 comprising having further machine-executable instructions that when executed cause the one or more machines to perform the method comprising:
    breaking the daisy chain configuration into a shorter daisy chain in response to determining that the known bit stream does not match with the bit stream received by the last RF transceiver chiplet.

5. The non-transitory machine-readable storage media of claim 3 comprising having further machine-executable instructions that when executed cause the one or more machines to perform the method comprising:
    setting the RF transceiver chiplets to transmit at a particular power level in response to determining that the known bit stream matches with the bit stream received by the last RF transceiver chiplet.

6. The non-transitory machine-readable storage media of claim 5 comprising having further machine-executable instructions that when executed cause the one or more machines to perform the method comprising:
  measuring output power levels of the RF transceiver chiplets;
  applying matching networks to maximize the output power levels; and
  storing values of the matching networks.

7. The non-transitory machine-readable storage media of claim 6 comprising having further machine-executable instructions that when executed cause the one or more machines to perform the method comprising:
  determining whether an output power level of the individual RF transceiver chiplet is substantially equal to the particular power level;
  recalibrating the output power level in response to determining that the output power level of the individual RF transceiver chiplet is not substantially equal to the particular power level; and
  storing calibration data of a transmitter of the individual RF transceiver chiplet in response to recalibrating the output power level.

8. The non-transitory machine-readable storage media of claim 7, wherein recalibrating the output power level comprises adjusting a programmable gain control.

9. The non-transitory machine-readable storage media of claim 7, wherein the individual RF transceiver chiplet is a first individual RF transceiver chiplet, wherein the method comprising:
  connecting the first individual RF transceiver chiplet in loopback with a second individual RF transceiver chiplet which is a neighbor of the first individual RF transceiver via integrated RF switches; and
  inserting a matching network between the first individual RF transceiver chiplet and the second individual RF transceiver chiplet if an impedance of a transmitter of the first individual RF transceiver chiplet is substantially different from an impedance of a receiver of the second individual RF transceiver chiplet.

10. The non-transitory machine-readable storage media of claim 9 comprising having further machine-executable instructions that when executed cause the one or more machines to perform the method comprising:
  increasing an output power of the transmitter of the first individual RF transceiver chiplet;
  monitoring an output of an analog-to-digital converter of the receiver of the second individual RF transceiver chiplet; and
  recording the output power of the transmitter of the first individual RF transceiver chiplet at which the output of the analog-to-digital converter reaches full-scale.

11. The non-transitory machine-readable storage media of claim 10 comprising having further machine-executable instructions that when executed cause the one or more machines to perform the method comprising: generating a power map based on the recording of the output power.

12. The non-transitory machine-readable storage media of claim 10 comprising having further machine-executable instructions that when executed cause the one or more machines to perform the method comprising:
  transmitting a known bit-stream by the transmitter of the first individual RF transceiver chiplet;
  monitoring a first bit-stream received by the receiver of the second individual RF transceiver chiplet;
  reducing the output power of the transmitter of the first individual RF transceiver chiplet;
  monitoring a second bit-stream received by the receiver of the second individual RF transceiver chiplet;
  computing a bit-error rate of the receiver based on the first bit-stream and the second bit-stream; and
  recording a sensitivity of the receiver based on the bit-error rate.

13. An apparatus comprising:
  a package substrate comprising an array of antennas;
  an active interposer coupled to the package substrate;
  an RF silicon coupled to the active interposer; and
  a heat sink coupled to the RF silicon via a thermal bond, wherein the RF silicon comprises RF transceiver chiplets in a daisy chain configuration, wherein the active interposer includes an RF signal chain, wherein the RF signal chain comprises integrated RF switches to couple the RF transceiver chiplets, wherein the active interposer is configured to:
  test the RF transceiver chiplets for transmission error; and
  tune and/or calibrate a matching network of an individual transceiver chiplet, from among the RF transceiver chiplets, to achieve maximum power transfer.

14. The apparatus of claim 13 comprising memory store values of the tuned and/or calibrated matching network in memory.

15. The apparatus of claim 13, wherein the RF transceiver chiplets include a first RF transceiver chiplet and a last RF transceiver chiplet in the daisy chain configuration, wherein the first RF transceiver chiplet is to transmit a known bit stream to the last RF transceiver chiplet.

16. The apparatus of claim 15 comprises:
  circuitry to compare the known bit stream with a bit stream received by the last RF transceiver chiplet; and
  logic to break the daisy chain configuration into a shorter daisy chain in response to a determination that the known bit stream does not match with the bit stream received by the last RF transceiver chiplet.

17. The apparatus of claim 16 comprising a second circuitry to set the RF transceiver chiplets to transmit at a particular power level in response to a determination that the known bit stream matches with the bit stream received by the last RF transceiver chiplet.

18. A method comprising:
  coupling RF transceiver chiplets, in an active RF silicon, in a daisy chain configuration, wherein coupling the RF transceiver chiplets comprises applying or using integrated RF switches in an active interposer to couple the RF transceiver chiplets;
  testing the RF transceiver chiplets for transmission error;
  tuning and/or calibrating a matching network of an individual transceiver chiplet, from among the RF transceiver chiplets, to achieve maximum power transfer; and
  storing values of the tuned and/or calibrated matching network in memory.

19. The method of claim 18, wherein testing the RF transceiver chiplets for the transmission error comprises:
  transmitting a known bit stream from a first RF transceiver chiplet to a last RF transceiver chiplet in the daisy chain configuration;
  comparing the known bit stream with a bit stream received by the last RF transceiver chiplet; and
  breaking the daisy chain configuration into a shorter daisy chain in response to determining that the known bit stream does not match with the bit stream received by the last RF transceiver chiplet.

20. The method of claim 19, comprising:
  setting the RF transceiver chiplets to transmit at a particular power level in response to determining that the known bit stream matches with the bit stream received by the last RF transceiver chiplet.

\* \* \* \* \*